US009839166B2

(12) United States Patent
Kim et al.

(10) Patent No.: US 9,839,166 B2
(45) Date of Patent: Dec. 5, 2017

(54) ELECTRONIC DEVICE HAVING HEAT RADIATOR AND METHOD FOR CONTROLLING THE ELECTRONIC DEVICE

(71) Applicant: Samsung Electronics Co., Ltd., Suwon-si (KR)

(72) Inventors: Tae-Yang Kim, Seoul (KR); Jae-Ho Chung, Suwon-si (KR); Young-Jun Choi, Seoul (KR); Eun-Sun Hwang, Busan (KR); Dong-Hyun Byun, Suwon-si (KR); Sang-Jin Wang, Suwon-si (KR); Suk-Jin Yun, Seoul (KR); Jae-Ho Lee, Seoul (KR); Jong-Chul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/053,439

(22) Filed: Feb. 25, 2016

(65) Prior Publication Data
US 2016/0255748 A1 Sep. 1, 2016

(30) Foreign Application Priority Data
Feb. 27, 2015 (KR) .................. 10-2015-0028640

(51) Int. Cl.
*G09C 5/00* (2006.01)
*H05K 7/20* (2006.01)
(Continued)

(52) U.S. Cl.
CPC ..... *H05K 7/20972* (2013.01); *G02B 27/0006* (2013.01); *G02B 27/017* (2013.01);
(Continued)

(58) Field of Classification Search
CPC ........ H05K 7/20972; G02B 2027/0178; G02B 27/017; G02B 2027/014
(Continued)

(56) References Cited

U.S. PATENT DOCUMENTS

2010/0079356 A1* 4/2010 Hoellwarth .......... G02B 27/017
345/8
2010/0110368 A1 5/2010 Chaum
(Continued)

FOREIGN PATENT DOCUMENTS

CN 101799585 A 8/2010
DE 3046046 A1 7/1982
(Continued)

OTHER PUBLICATIONS

European Search Report for Appln. No. 16157122.9-1562 dated Aug. 4, 2016.
(Continued)

*Primary Examiner* — Sherman Ng
(74) *Attorney, Agent, or Firm* — McAndrews, Held & Malloy, Ltd.

(57) ABSTRACT

An electronic device having a heat radiator and a method for controlling the electronic device are provided. The electronic device includes a frame including at least one optical assembly and a structure configured to receive a portable electronic device including a display, wherein an image is on the display can be seen through the at least one optical assembly when the portable electronic device is in the structure, a wearing member connected to the frame and configured to be worn together with the frame on the head of a user, and a heat radiator configured to remove heat from a space between the display and the optical assembly to outside the electronic device when the portable electronic device is received in the structure and is turned on.

38 Claims, 23 Drawing Sheets

(51) Int. Cl.
*H05K 5/00* (2006.01)
*H05K 5/03* (2006.01)
*G02B 27/01* (2006.01)
*G02B 27/00* (2006.01)

(52) U.S. Cl.
CPC ....... *G02B 27/0176* (2013.01); *H05K 5/0017* (2013.01); *H05K 5/03* (2013.01); *G02B 2027/014* (2013.01); *G02B 2027/0156* (2013.01); *G02B 2027/0178* (2013.01)

(58) Field of Classification Search
USPC .......................................................... 345/8
See application file for complete search history.

(56) References Cited

U.S. PATENT DOCUMENTS

| | | |
|---|---|---|
| 2014/0098009 A1 | 4/2014 | Prest et al. |
| 2014/0333773 A1 | 11/2014 | Davis et al. |
| 2014/0362445 A1 | 12/2014 | Welker |
| 2016/0004085 A1 | 1/2016 | Stroetmann |

FOREIGN PATENT DOCUMENTS

| | | |
|---|---|---|
| DE | 202013102458 U1 | 7/2013 |
| DE | 20-2014-006891 U1 | 10/2014 |
| WO | 2012011893 A1 | 1/2012 |

OTHER PUBLICATIONS

European Search Report for Appln. No. 16157122.9-1562 dated Dec. 12, 2016.

\* cited by examiner

[도10]

ELECTRONIC DEVICE HAVING HEAT RADIATOR AND METHOD FOR CONTROLLING THE ELECTRONIC DEVICE

RELATED APPLICATION(S)

This application claims the benefit under 35 U.S.C. §119(a) of a Korean patent application filed in the Korean Intellectual Property Office on Feb. 27, 2015 and assigned Serial No. 10-2015-0028640, the entire disclosure of which is incorporated herein by reference.

BACKGROUND

The present disclosure relates to an electronic device having a heat radiator, and a method for controlling the electronic device.

Some electronic devices are wearable on a body, and are generally called wearable devices. Wearable devices include a head-mounted display or device (HMD), smart glasses, a smart watch or wristband, a contact lens-type device, a ring-type device, a shoe-type device, a clothes-type device, a glove-type device, and the like. Wearable devices may be configured in various shapes that make them wearable on a human body or detachably attached to clothes. As the wearable devices are worn and are easily accessible, they have improved portability and accessibility for users.

An HMD wearable on or around a user's head is an exemplary wearable electronic device. HMDs may be classified largely into a see-through type and a see-closed type. The see-through type provides augmented reality (AR), whereas the see-closed type provides virtual reality (VR).

For example, Google Glass is the see-through type. Google Glass may provide information that is not available by just looking at the real world with naked eyes by merging and combining virtual objects based on the real world using the features of a semi-transparent lens. Sony HMZ is an example of the see-closed type. Sony HMZ is an electronic device with two displays placed in front of a user's eyes. As the user only views content received through an external input (a game, a movie, streaming, broadcasting, or the like) on an independent screen, Sony HMZ may provide the user with a great sense of immersion.

When a processor intensive application such as a video and three-dimensional (3D) content is executed in conventional HMDs, the built-in display module, the graphics processing unit (GPU), and/or an electronic device such as a detachable terminal generates heat, resulting in degradation of the performance of the HMD and/or the detachable electronic device.

Moreover, a user may have difficulty in comfortably viewing or playing a processor intensive VR application due to heat emitted from the HMD or the electronic device detachably attached to the HMD.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to provide an electronic device having a heat radiator for efficiently radiating heat generated along with operation of an HMD or operation of an electronic device detachably mounted to the HMD, and a method for controlling the electronic device.

In accordance with an aspect of the present disclosure, there is provided an electronic device. The electronic device includes a frame including at least one optical assembly and a structure configured to receive a portable electronic device including a display, wherein an image is on the display can be seen through the at least one optical assembly when the portable electronic device is in the structure, a wearing member connected to the frame and configured to be worn together with the frame on the head of a user, and a heat radiator configured to remove heat from a space between the display and the optical assembly to outside the electronic device when the portable electronic device is received in the structure and is turned on.

In accordance with another aspect of the present disclosure, there is provided an electronic device. The electronic device includes a frame including at least one optical assembly and a structure to receive a portable electronic device including a display, and wherein when an image on the display can be seen through the at least one optical assembly when the portable electronic device is mounted in the structure, a wearing member connected to the frame and configured to be worn together with the frame on the head of a user, and a fan configured to generate air flow in a space between the display and the optical assembly when the portable electronic device is mounted in the structure and is turned on.

In accordance with another aspect of the present disclosure, there is provided a method for controlling heat radiation in an electronic device. The method includes making a determination of whether a user is wearing the electronic device with a portable electronic device mounted thereon, the portable electronic device displaying a screen according to at least one of a virtual reality (VR) operation and a see-through operation, and operating a heat radiator installed in the electronic device to remove heat from the portable electronic device.

In accordance with another aspect of the present disclosure, there is provided a method for controlling heat radiation in an electronic device. The method includes detecting temperature of a portable electronic device when the portable electronic device is mounted in the electronic device and is displaying images according to at least one of a virtual reality (VR) operation and a see-through operation, and operating a heat radiator installed in the electronic device to remove heat from the portable electronic device according to the detected temperature.

In accordance with another aspect of the present disclosure, there is provided a method for controlling heat radiation in an electronic device. The method includes making a determination of whether a user is wearing the electronic device with a portable electronic device mounted thereon, the portable electronic device displaying a screen according to at least one of a virtual reality (VR) operation and a see-through operation, detecting temperature of the portable electronic device, and operating a heat radiator installed in the electronic device to remove heat from the portable electronic device.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other aspects, features and advantages of certain exemplary embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
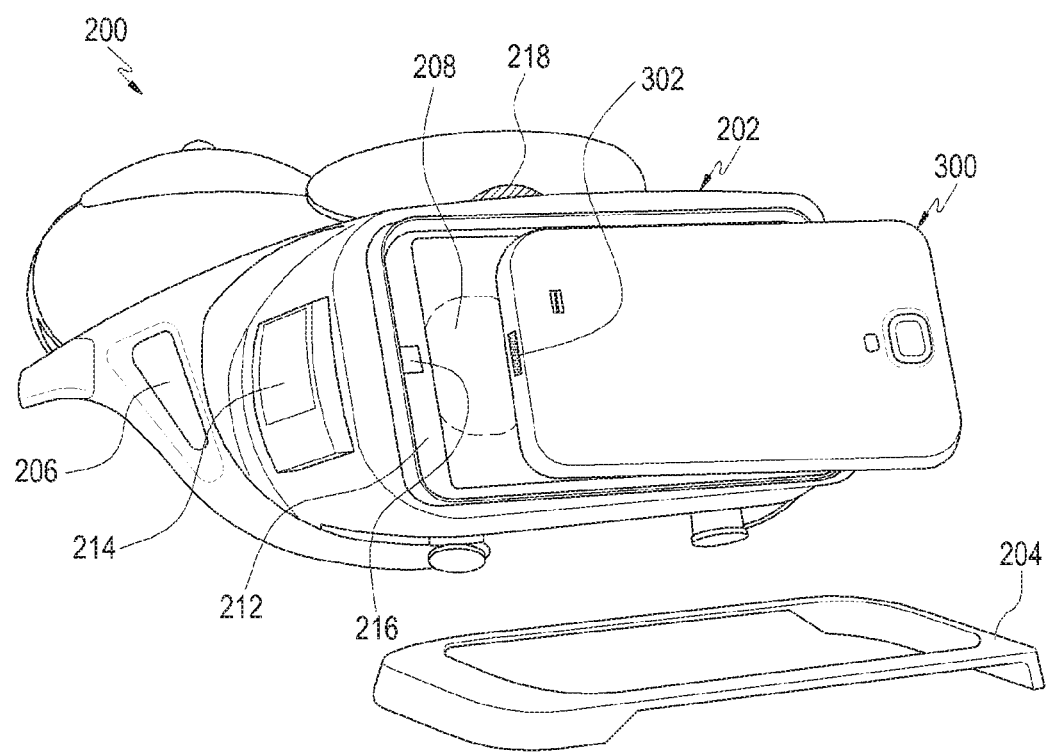
FIG. 1 illustrates an example in which a portable electronic device is mounted on a device according to various embodiments of the present disclosure.

Various embodiments of the present disclosure are described with reference to the accompanying drawings. Various embodiments of the present disclosure can be subject to various modifications and implemented. Specific embodiments are illustrated in the drawings and described in detail. However, the scope of the present disclosure is not intended to be limited to the particular embodiments and it is to be understood that the present disclosure covers all modifications, equivalents, and/or alternatives falling within the scope and spirit of the present disclosure. In relation to a description of the drawings, like reference numerals denote the same components.

The terms as used in the present disclosure are provided to describe specific embodiments, and are not intended to limit the scope of other embodiments. It is to be understood that singular forms include plural referents unless the context clearly dictates otherwise.

In the present disclosure, the term "have," "may have," "include," or "may include" signifies the presence of a specific function, operation, or component, not excluding the presence of one or more additional functions, operations, or components. Also, in various embodiments of the present disclosure, the term "have," "may have," "include," or "may include" signifies the presence of a specific feature, number, step, operation, component, or part, or their combination, not excluding the presence or addition of one or more other features, numbers, steps, operations, components, or parts, or a combination thereof.

In the present disclosure, the term "and/or" may cover all possible combinations of enumerated words. For example, "A and/or B" may represent just A, just B, or both A and B.

Expressions such as "first" and "second" may modify various components in various embodiments, not limit the components. For example, the expressions do not limit the sequence and/or importance of the components. These expressions are generally to be used to distinguish one component from another component. For example, a first user equipment (UE) and a second UE may be the same UEs or different UEs. Accordingly, a first component may be referred to as a second component and vice versa without departing the scope of the present disclosure.

When it is said that when a first component is "operatively or communicatively coupled with/to" or "connected to" a second component, it should be understood that the first component is connected to the second component directly or through at least another component. On the other hand, when it is said that a first component is "directly connected to" or "directly coupled to" a second component, it should be understood that there is no other component between the first and second components.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

An electronic device according to various embodiments of the present disclosure may also be referred to as, for example, a portable electronic device or a device, which is described in the later-described various embodiments of the present disclosure.

According to various embodiments of the present disclosure, an electronic device may be, for example, a smartphone, a tablet personal computer (PC), a mobile phone, a video phone, an e-book reader, a desktop PC, a laptop PC, a netbook computer, a personal digital assistant (PDA), a portable multimedia player (PMP), an MP3 player, a mobile medical equipment, a camera, and a wearable device (for example, a head-mounted device (HMD) such as electronic glasses, electronic clothes, an electronic bracelet, an electronic necklace, an electronic appcessory, an electronic tattoo, or a smart watch).

According to some embodiments, an electronic device may be a smart home appliance. For example, the smart home appliance may be at least one of a television (TV), a digital versatile disk (DVD) player, an audio player, a refrigerator, an air conditioner, a vacuum cleaner, an oven, a micro oven, a washer, an air purifier, a set-top box, a TV box (for example, Samsung HomeSync™, Apple TV™, Google TV™, or the like), a game console, an electronic dictionary, an electronic key, a camcorder, and an electronic picture frame.

According to some embodiments, an electronic device may be at least one of a medical device (for example, a magnetic resonance angiography (MRA) device, a magnetic resonance imaging (MRI) device, a computed tomography (CT) device, an imaging device, an ultrasonic device, or the like), a navigation device, a global positioning system (GPS) receiver, an event data recorder (EDR), a flight data recorder (FDR), an automotive infotainment device, a naval electronic device (for example, a naval navigation device, a gyrocompass, or the like), an avionic electronic device, a security device, an in-vehicle head unit, an industrial or consumer robot, an automatic teller machine (ATM) in a financial facility, and a point of sales (POS) device in a shop.

According to some embodiments, an electronic device may be at least one of furniture, part of a building/structure, an electronic board, an electronic signature receiving device, a projector, and various measuring devices (for example, water, electricity, gas or electro-magnetic wave measuring devices).

According to various embodiments, an electronic device may be one or a combination of two or more of the foregoing devices. According to various embodiments, an electronic device may be a flexible device. In addition, it will be apparent to one having ordinary skill in the art that an electronic device according to various embodiments of the present disclosure is not limited to the foregoing devices.

The term "user" as used in various embodiments of the present disclosure may refer to a person or device (for example, artificial intelligence electronic device) that uses an electronic device. Furthermore, the term "wearer" as used in various embodiments of the present disclosure may refer to a person that wears an HMD on the head and uses content provided by the HMD or an electronic device detachably mounted on the HMD.

Figure 2:
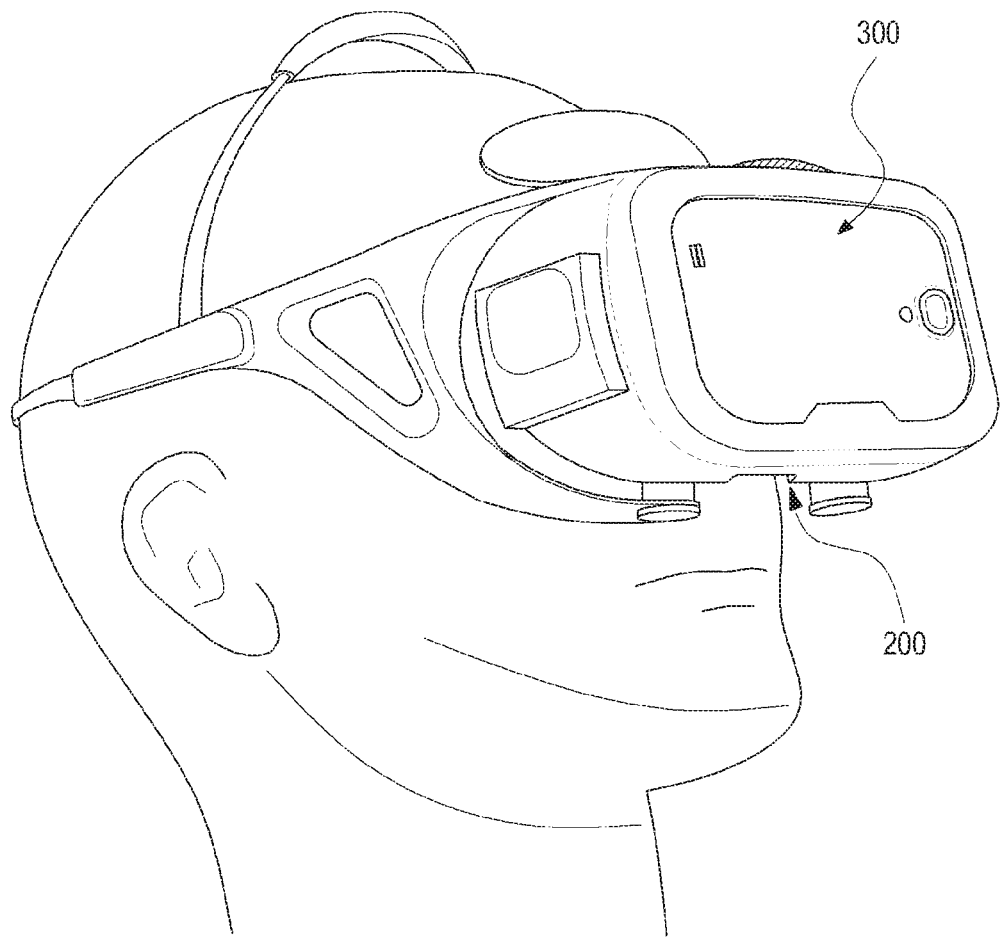
FIG. 2 illustrates an example in which a user wears a device with a portable electronic device mounted thereon according to various embodiments of the present disclosure.
Figure 3:
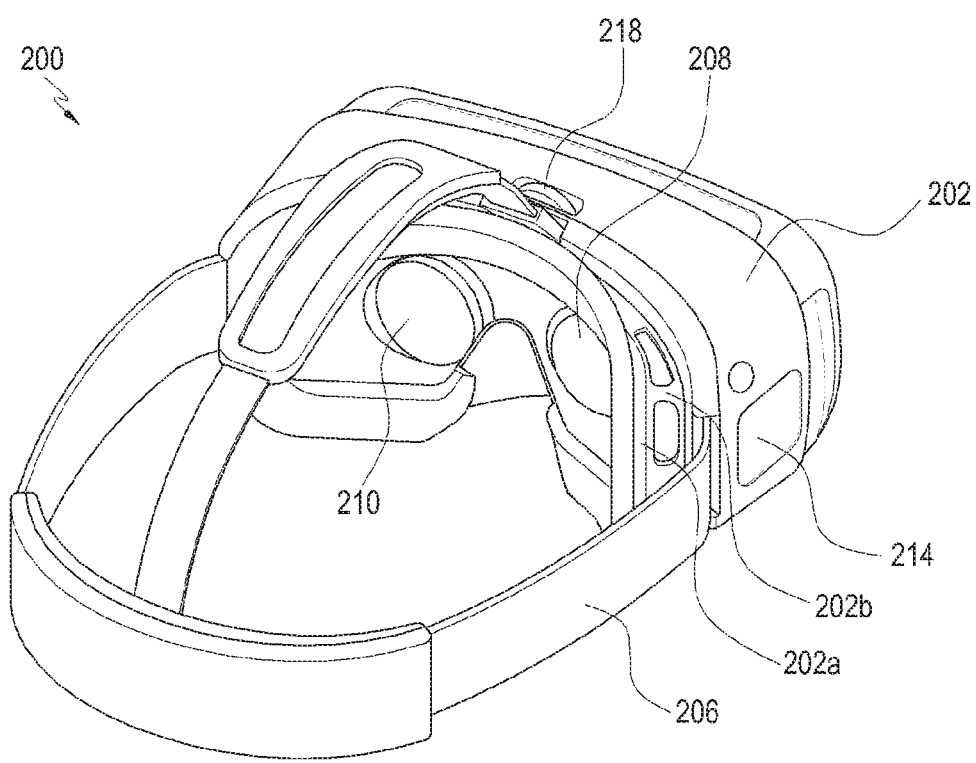
FIG. 3 is a perspective view of an exemplary device from an oblique angle, according to various embodiments of the present disclosure.
Figure 4:
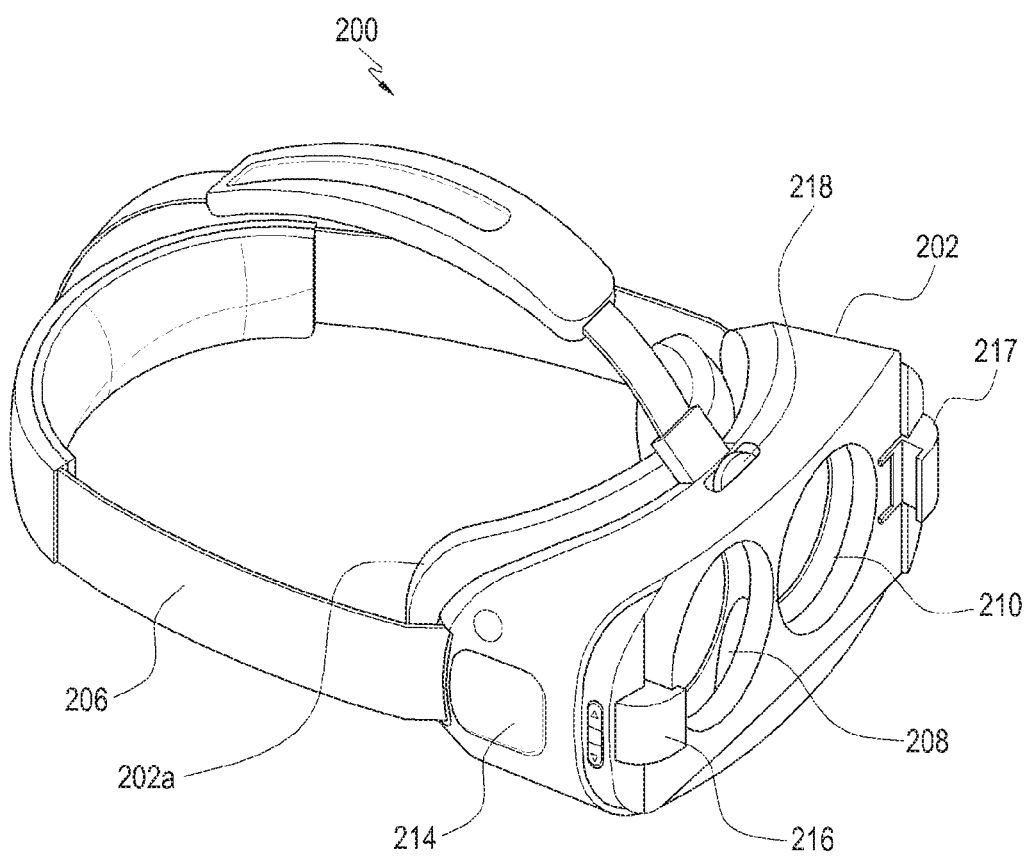
FIG. 4 is a perspective view of an exemplary device from an oblique angle, according to various embodiments of the present disclosure.

FIG. 1 illustrates an example in which a portable electronic is mounted on a device 200 according to various embodiments of the present disclosure, and FIG. 2 illustrates an example in which a user wears the device 200 with the portable electronic device 300 mounted thereon according to various embodiments of the present disclosure. FIG. 3 is a perspective view of the device 200 taken from a different direction, according to various embodiments of the present disclosure, and FIG. 4 is a perspective view of the device 200 taken from the front, according to various embodiments of the present disclosure.

Referring to FIGS. 1 to 4, an electronic device of the present disclosure (hereinafter, referred to as an 'HMD') may be the device 200 with a display or a transparent/semi-transparent lens and able to physically attach to a portable electronic device 300. The HMD may be configured to be fixed on the head of a user and selectively implement a user interface (UI). According to an embodiment of the present disclosure, the portable electronic device 300 having a display may be fixed to the device 200 or detachably mounted on the device 200.

The HMD of the present disclosure may provide at least one of a see-though function for providing augmented reality (AR) or a see-closed function for providing virtual reality (VR).

The see-through function may typically refer to, for example, a function for transferring a real external object(s) to the eyes of a user through the display or the transparent/semi-transparent lens and providing the object(s) and/or a virtual object to the user as visual input or as other sensory input. The see-through function may provide the user with additional information about an actually viewed object and images of the object. In another embodiment, additional information may be provided to the user through a hologram without a display or a lens.

The see-closed function may be provided by means of a separate display. In an embodiment, the HMD may be configured to have two displays placed in front of the eyes of the user, so that the user may view content (a game, a movie, streaming video, a broadcast, or the like) through the displays. The see-closed function may provide the user with a sense of immersion using an independent screen.

The HMD of the present disclosure may include the portable electronic device 300, the device 200, and a heat radiator 400.

The portable electronic device 300 may be, for example, a smartphone, a mobile phone, a navigation device, a game device, a TV, a head unit for vehicles, a laptop computer, a tablet computer, a personal media player (PMP), or a personal digital assistant (PDA). The electronic device may be implemented as a pocket-sized portable communication terminal with a radio communication function. According to an embodiment of the present disclosure, the electronic device may be a flexible device or a flexible display. The portable electronic device 300 may be detachably mounted on the device 200 and display a screen according to at least one of a VR operation and a see-through operation.

The device 200 may have a mounting surface 212 in at least a part of the periphery of the device 200 on which the portable electronic device 300 is mounted, and the device 200 may fit on the face of a user.

The heat radiator 400 (FIG. 6) may be provided in the device 200, specifically on a side surface of a frame 202 of the device 200. One or more heat radiators 400 may be provided to remove heat generated by the portable electronic device 300.

The device 200 may include the frame 202 and a cover 204.

A space or structure for accommodating, for example, the portable electronic device 300 may be included in the frame 202. The frame 202 may further include a lens assembly 202b (or optical assembly) including two lenses 208 and 210 adjacent to each other placed between a display of the portable electronic device 300 and the eyes of the user. If the portable electronic device 300 is mounted on the device 200, the connector 216 may be provided on a side surface of the frame 202 to electrically connect the device 200 to the portable electronic device 300 so that the device 200 and the portable electronic device 300 may interact with each other. The lens assembly 202b including the two lenses 208 and 210 may be provided between the display of the portable electronic device 300 and the eyes of the user in the frame 202.

An outlet for discharging air introduced in to the frame 202 through the heat radiator 400 may be provided in at least a part of the frame 202, specifically under the frame 202. The outlet may be formed separately in the frame 202 or a hole formed between the frame 202 and the lens assembly 202b may be used as the outlet. The outlet for discharging air will be described later.

The frame 202 may be formed of a relatively lightweight material such as, for example, plastic for good wearability. However, the material of the frame 202 is not limited thereto. In another embodiment, the material of the frame 202 may include at least one of various other materials such as, for example, glass, ceramic, a metal such as aluminum, iron, stainless steel (STS), and a metal alloy such as a titanium alloy or a magnesium alloy, for an increased strength or enhanced looks.

The frame 202 may include, for example, a touch panel as a UI on a part of an outer surface of the frame 202. The touch panel may be provided on the outer surface of the frame 202 so that the positions of one or more displays or the positions of the lenses 208 and 210 may be adjusted. Or a control device 214 may be provided in the frame 202 to control the portable electronic device 300. The control device 214 will be described later.

The cover 204 is detachably mounted on the device 200. If the portable electronic device 300 is mounted on the device 200, the cover 204 may fix the portable electronic device 300 to the device 200. The cover 204 may cover the periphery of the rear surface of the portable electronic device 300 to keep the portable electronic device 300 securely mounted on the device 200.

While it is described by way of example that the cover 204 is provided on one surface of the device 200 to keep the portable electronic device 300 mounted on the device 200 in the embodiment of the present disclosure, the present disclosure is not limited thereto. For example, the mounting surface 212 may be provided on at least a part of the device 200 so that the portable electronic device 300 may be mounted on the mounting surface 212. If a structure is provided to fixedly support the portable electronic device 300 at both sides of the mounting surface 212, the cover 204 may not be needed.

Figure 6:
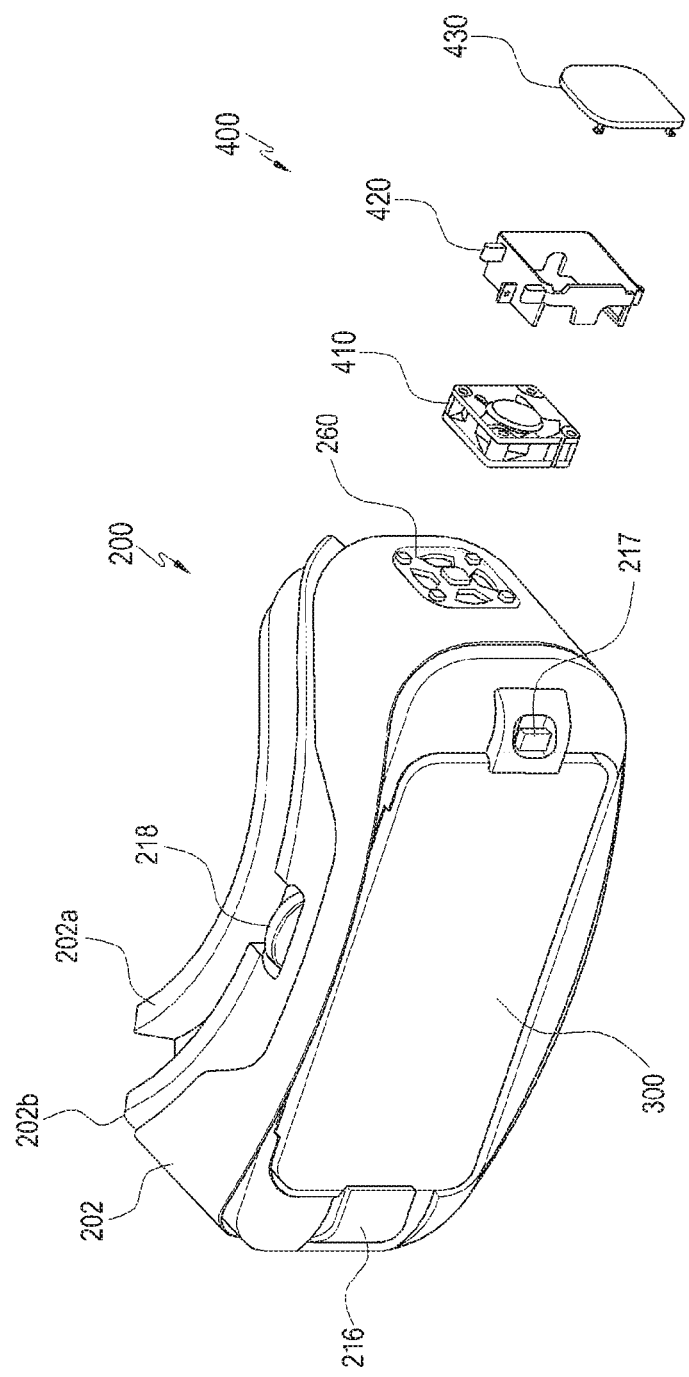
FIG. 6 is an exploded perspective view of a heat radiator in an electronic device according to various embodiments of the present disclosure.

According to an embodiment of the present disclosure, the frame 202 may include a support member (or 'wearing member') 206, the lens assembly 202b the mounting surface 212, the connector 216, a face contact 202a, the control device 214, a position adjuster 218, and a mounting opening unit 260 (FIG. 6).

The support member 206 may secure the device 200 to the user's head. The support member 206 may be, for example, a band formed of an elastic material, eyeglass temples, a helmet, or a strap. The support member 206 may bring the frame 202 into close contact with the area of the face around the eyes of the user.

The lens assembly 202b includes the lenses 208 and 210 at positions corresponding to the eyes of the wearer and may be installed on an inner surface of the frame 202. The wearer may view a screen on a display (not shown) through the lenses 208 and 210. One surface of each of the lenses 208 and 210 may be exposed toward the face contact 202a, to be described below, so that the user may view the screen of the display, and the other surface of each of the lenses 208 and 210 may be exposed toward the mounting surface 212 so that a screen of the display of the portable electronic device 300 mounted on the front surface of the device 200 may be viewed.

The mounting surface 212 may recede from at least a part of the frame 202, specifically the front surface of the frame 202, thus providing a space in which the portable electronic device 300 may fit. The mounting surface 212 may be a mechanical structure with which to detachably mount the portable electronic device 300 on the device 200. The mounting surface 212 may be formed of a flexible material or a deformable material such as an elastic material so as to accommodate various portable electronic devices 300 of different sizes. Since the mounting surface 212 is formed of a flexible or deformable material, when the portable electronic device 300 mounted on the mounting surface 212 is fixed by the cover 204 or a structure securing the portable electronic device 300, the display of the portable electronic device 300 may be brought into close contact with the mounting surface 212 without being scratched or breaking. The connector 216 and a support 217, which will be described later, are provided on the mounting surface 212 in order to electrically connect the portable electronic device 300 to the device 200 while supporting the portable electronic device 300 onto the mounting surface 212.

The connector 216 may be provided so that when the portable electronic device 300 is mounted on the device 200, the connector 216 may be connected to a connection terminal 302 of the portable electronic device 300 and thus enable communication between the device 200 and the portable electronic device 300. Specifically, the connector 216 may be disposed at a side of the mounting surface 212 and fixedly support a side of the portable electronic device 300 while electrically connecting to the connection terminal 302 of the portable electronic device 300, as illustrated in FIG. 4 and FIG. 6.

The support 217 may be positioned on the frame 202, specifically at the other side of the mounting surface 212 from the connector 216 in order to support the side opposite to the connection terminal 302 of the portable electronic device 300, as illustrated in FIG. 4 and FIG. 6. Therefore, when the portable electronic device 300 is mounted on the mounting surface 212, one side of the portable electronic device 300 may be supported by the connector 216 in electrical connection to the connector 216, and the other side of the portable electronic device 300 may be supported by the support 217.

The face contact 202a is positioned in at least a part of the frame 202, specifically on a rear surface of the frame 202, as illustrated in FIG. 4. When the user wears the HMD on the face, the face contact 202a contacts the face of the user. The face contact 202a may be generally shaped to fit the face of a user, and may include a porous, elastic body in at least a part of the face contact 202a so that the face contact 202a may be stably brought into close contact with the face of the user, and may remove moisture caused by heat generated from the user's body. A part of the face contact 202a may include a nose recess that fits over the nose of the user.

The control device 214 may be installed on a surface of the frame 202, for example, on the outer surface of the frame 202. The control device 214 may be an adjustment device with which the user adjusts an input for controlling the HMD, for example, the position of the display of the portable electronic device 300, or an adjustment unit with which the user adjusts the positions of the lenses 208 and 210. The control device 214 may also be used to control the portable electronic device 300. For example, the control device 214 may include at least one of a physical key, a physical button, a touch panel, a joystick, a button, a wheel key, and a touch pad. If the control device 214 is configured as a touch panel, the control device 214 may receive a user's touch input. The touch input may be a direct touch input on the touch panel or a hovering input above the touch panel. If the control device 214 is configured as a touch pad, the control device 214 may display a graphical user interface (GUI) for controlling functions of the portable electronic device 300. For example, a GUI for controlling sound or images may be displayed.

As described before, when the portable electronic device 300 is mounted on the device 200, the connection terminal 302 of the portable electronic device 300 may be connected to the connector 216 of the device 200 and thus a touch input received by the touch panel may be transmitted to the portable electronic device 300. The portable electronic device 300 may control a function corresponding to the touch input received from the touch panel in response to the touch input. For example, the portable electronic device 300 may control a sound volume or video play in response to the received touch input.

The position adjuster 218 may be installed on a surface of the frame 202, for example, on an outer top surface of the frame 202. The position adjuster 218 may adjust the position of the display of the portable electronic device 300 or the positions of the lenses 208 and 210, separately from the control device 214.

The portable electronic device 300 may be, for example, a smart phone with a camera installed on its rear surface. The user may mount the portable electronic device 300 on the mounting surface 212 of the device 200 so that the front of the portable electronic device 300 where the display is may face the lenses 28 and 210. The user may fix the portable electronic device 300 to the device 200 by covering the portable electronic device 300 with the cover 204. The user may wear the device 200 with the portable electronic device 300 on his head, as illustrated in FIG. 2. The user may view a screen on the display of the portable electronic device 300 through the lenses 208 and 210 of the worn device 200.

The mounting opening unit 260 (FIG. 6) may be provided on a side surface of the frame 202. The heat radiator 400 (FIG. 6) may be installed inside the mounting opening unit 260 and thus the mounting opening unit 260 may introduce external air into the device 200, specifically the frame 202 along with operation of the heat radiator 400.

Figure 5:
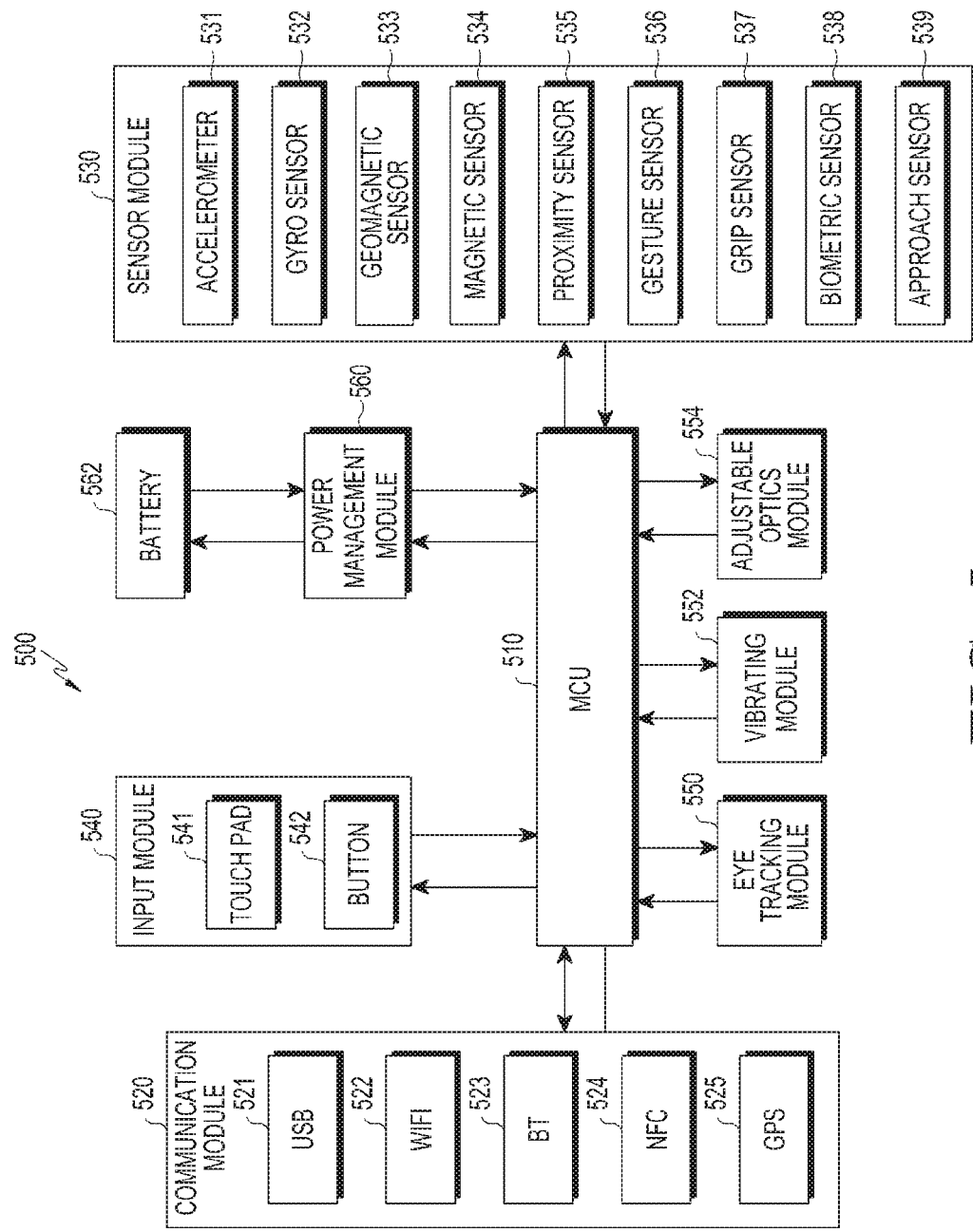
FIG. 5 is a block diagram of an exemplary device according to various embodiments of the present disclosure.

FIG. 5 is a block diagram of a device 500 according to various embodiments of the present disclosure.

Referring to FIG. 5, the device 500 may include a micro controller unit (MCU) 510, a communication module 520, a sensor module 530, an input module 540, an eye tracking module 550, a vibrating module 552, an adjustable optics module 554, a power management module 560, and a battery 562.

The MCU 510 may be a controller of the device 500, which controls other components (for example, the communication module 520, the sensor module 530, the input module 540, the eye tracking module 550, the vibrating module 552, the adjustable optics module 554, the power management module 560, and the battery 562) by executing an operating system (OS) or an embedded software program. The MCU 510 may include a processor and a memory.

The communication module 520 may perform data transmission and reception between the portable electronic device 300 and the device 500 by electrically connecting the portable electronic device 300 and the device 500 through wired or wireless communication. According to an embodiment, the communication module 520 may include a universal serial bus (USB) module 521, a WiFi module 522, a Bluetooth (BT) module 523, a near field communication (NFC) module 524, and a global positioning system (GPS) module 525. According to an embodiment, at least two of the USB module 521, the WiFi module 522, the BT module 523, the NFC module 524, and the GPS module 525 may be included in a single integrated chip (IC) or IC package.

The sensor module 530 may measure physical quantities or detect operational states of the device 500, and convert the measured or detected information into electric signals. The sensor module 530 may include at least one of, for example, an accelerometer 531, a gyro sensor 532, a geomagnetic sensor 533, a magnetic sensor 534, a proximity sensor 535, a gesture sensor 536, a grip sensor 537, a biometric sensor 538, and an approach sensor 539. The device 500 may sense movement of the head of the wearer wearing the device 500 using at least one of, for example, the accelerometer 531, the gyro sensor 532, and the geomagnetic sensor 533. The device 500 may sense whether the device 500 is worn using, for example, the proximity sensor 535 or the grip sensor 537. According to an embodiment, the device 500 may sense whether the user wears the device 500 by at least one of, for example, infrared (IR) recognition, pressure recognition, and sensing of a variation in capacitance (or a dielectric constant). The gesture sensor 436 may sense a motion of a hand or finger of the user and receive information about the sensed motion as an input of the device 500. The device 500 may sense that an object is approaching the user by means of the approach sensor 439. Additionally or alternatively, the sensor module 530 may include a biometric sensor such as an electrical-nose (E-nose) sensor, an electromyography (EMG) sensor, an ElectroEncephaloGram (EEG) sensor, an electrocardiogram (ECG) sensor, an iris sensor, and a finger print sensor, and recognize biometric information about the user using the biometric sensor. The sensor module 530 may further include a control circuit for controlling one or more sensors included therein.

The input module 540 may be the control device 214 illustrated in FIG. 1. The input module 540 may include a touch pad 541 and a button 542. The touch pad 541 may operate in at least one of, for example, capacitive, resistive, infrared, and ultrasonic methods. The touch pad 541 may further include a control circuit. If the touch pad 541 is a capacitive type, physical contact or proximity may be recognized. The touch pad 541 may further include a tactile layer to thereby provide haptic feedback to the user. The button 542 may include, for example, a physical button, an optical key, or a keypad.

The power management module 560 may manage power of the device 500. While not shown, the power management module 560 may include a power management integrated circuit (PMIC), a charger IC, and/or a battery fuel gauge.

The PMIC may be loaded in, for example, an IC or a single on chip (SoC) semiconductor. Charging may be wireless or wired. The charger IC may be used in charging a battery and prevent introduction of overvoltage or overcurrent from a charger. According to an embodiment, there may be a charger IC for at least one of wired charging and wireless charging. Wireless charging may be performed, for example, in a magnetic resonance scheme, a magnetic induction scheme, or an electromagnetic wave scheme, and may use additional circuits for wireless charging, such as a coil loop, a resonance circuit, and/or a rectifier.

The battery fuel gauge may measure, for example, a charge level, a voltage while charging, current, and/or temperature of the battery 562. The battery 562 may include, for example, a rechargeable battery or a solar battery.

The eye tracking module 550 may track the eyes of the user with at least one of, for example, an electrical oculography (EOG) sensor, a coil system, a dual purkinje system, a bright pupil system, and a dark pupil system. The eye tracking module 550 may include a micro camera for eye tracking.

The vibrating module 552 may generate mechanical vibrations from electrical signals. This may be used to notify the user of incoming calls, status updates (e.g. message/email waiting), and the like in place of or in addition to audible and/or visual notices.

The adjustable optics module 554 may measure an interpupil distance (IPD) of the user so that the user may view an image suitable for the user's sight. The device 500 may adjust the distance between the lenses according to the IPD of the user measured by the adjustable optics module 554. The device 500 may transmit the IPD of the user measured by the adjustable optics module 554 to the portable electronic device 300 so that the display position of a screen may be adjusted on the display of the portable electronic device 300.

The MCU 510 may transmit a motion signal sensed through a motion sensor of the sensor module 530 to the portable electronic device 300. The motion sensor may be at least one of the accelerometer 531, the gyro sensor 532, and the geomagnetic sensor 533.

The MCU 510 may sense that an object is approaching the user and transmit an approach sensing signal to the portable electronic device 300. The MCU 510 may measure a direction from which the object is approaching the wearer of the device 500 and transmit information indicating the measured direction to the portable electronic device 300.

An IR sensor, an ultrasonic sensor, a radio frequency (RF) sensor, and/or a space sensor like radar may be used as the approach sensor 539. The RF sensor may be, for example, a WiSee sensor and/or an AllSee sensor. According to an embodiment, a wireless communication module may be used as the approach sensor 539. The wireless communication module may be at least one of, for example, the WiFi module 522, the BT module 523, the NFC module 524, and the GPS module 525. If an object is approaching the device 500, the object may weaken the received signal strength indication (RSSI) of a wireless communication signal received at the wireless communication module. If the RSSI rapidly drops below a predetermined threshold for a stationary user, the MCU 510 may sense that an object is approaching. Furthermore, the MCU 510 may sense an object-approaching direction from the direction in which the RSSI drops below the predetermined threshold.

Figure 7:
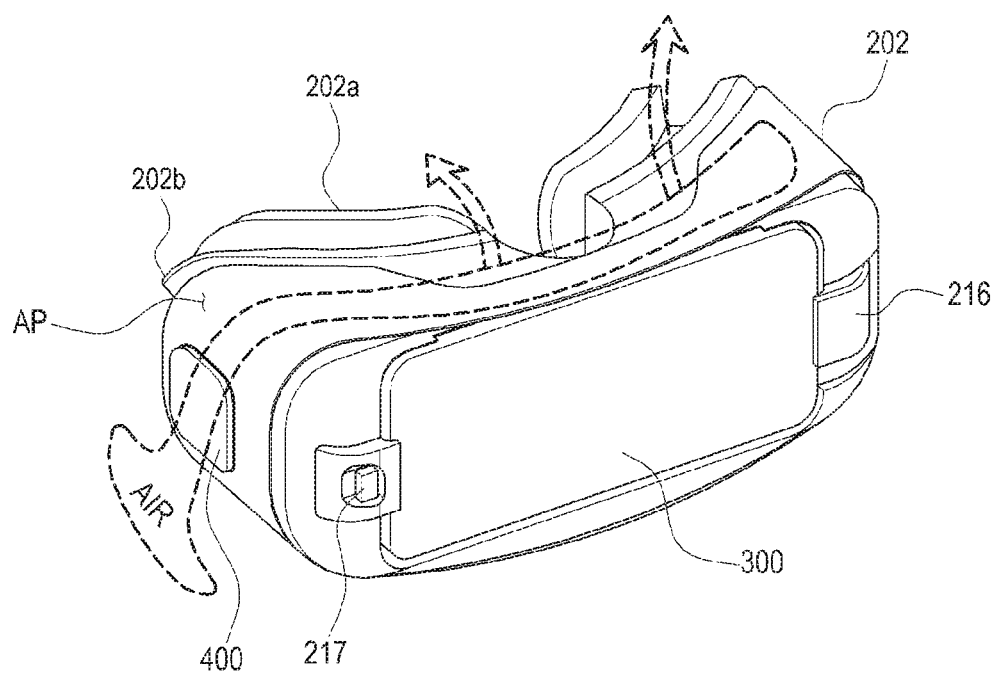
FIG. 7 illustrates air flow generated by a heat radiator in an electronic device according to various embodiments of the present disclosure.

FIG. 6 is an exploded perspective view of a heat radiator in an electronic device according to various embodiments of the present disclosure, and FIG. 7 illustrates air flow generated from the heat radiator 400 in an electronic device according to various embodiments of the present disclosure.

Referring to FIGS. 6 and 7, a HMD may be provided with the heat radiator 400. Specifically, the heat radiator 400 may be disposed in the device 200, specifically on a side surface of the frame 202. The heat radiator 400 may help dissipate heat generated by the portable electronic device 300 by introducing external air in to the frame 202. The heat radiator 400 may be a fan type with a blade, or a piezo cooler. When the heat radiator 400 is operating, the heat radiator 400 may dissipate the heat discharged from the portable electronic device 300 by bringing external air in to the frame 202.

Heat from the portable electronic device 300 may be transferred to the air introduced in to the frame 202 through the heat radiator 400, and then the air may be discharged through an outlet in the frame 202, which may be, for example, on the bottom surface of the frame 202. Accordingly, the heat radiator 400 may control discharge of heat generated by the portable electronic device 300 by bringing in external air in to the frame 202. Or the heat radiator 400 may control discharge of heat generated by the portable electronic device 300 by discharging air inside the frame to the outside. That is, the interior of the frame 202 may be heated with heat generated by the portable electronic device 300 and heated air inside the frame 202 may be discharged to the outside, thus making it more comfortable for the user of the device 200.

If air inside the frame 202 is discharged to the outside, a heat diffusion member 600 (FIG. 14) may be installed to more efficiently transfer heat from the portable electronic device 300 to the air in the frame 202. The heat diffusion member 600 may be, for example, a graphite sheet, a heat transfer member containing carbon such as graphene, a metal member such as a copper sheet, or a heat transfer member such as a heat pipe or heat sink may be installed. Accordingly, heat transfer members 700 (FIG. 15) may be installed in the vicinity of the heat diffusion member 600 (FIG. 14) or the air outlet (not shown) to better remove excess heat.

The heat radiator 400 may include the fan 410, the fan duct 420, and the fan cover member 430. The fan 410 and the fan duct 420 may be installed in the frame 202, specifically in the mounting opening unit 260 (FIG. 6). The fan 410 may be configured as a blade or a piezo cooler. As the fan 410 operates, the fan 410 sucks air from the outside and supplies the air in to the frame 202, thus controlling cooling of the portable electronic device 300.

The fan duct 420 may be provided to surround the fan 410. The fan duct 420 may be installed on a peripheral surface of the mounting opening unit 260. The fan cover member 430 may be engaged on the exterior of the frame 202 to guide flow of air from the outside.

The heat radiator 400 may be on one side of the device 200 or both sides of the device 200. Various embodiments of the disclosure may place the heat radiator 400 in different parts of the frame 202 according to design and/or implementation needs.

Figure 8:
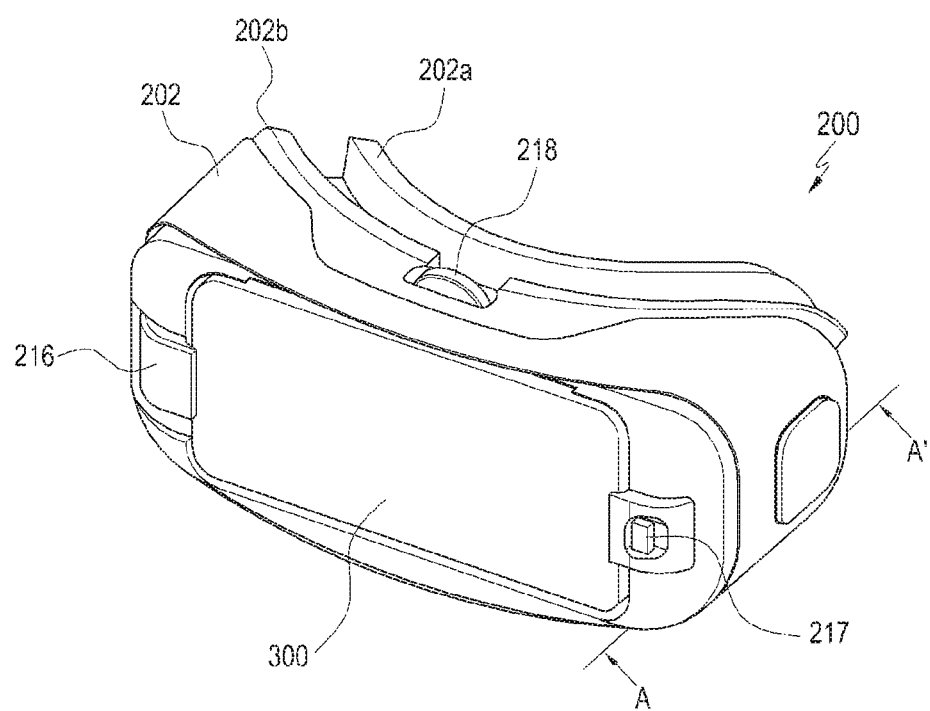
FIG. 8 is an assembled perspective view of an electronic device according to various embodiments of the present disclosure.
Figure 9:
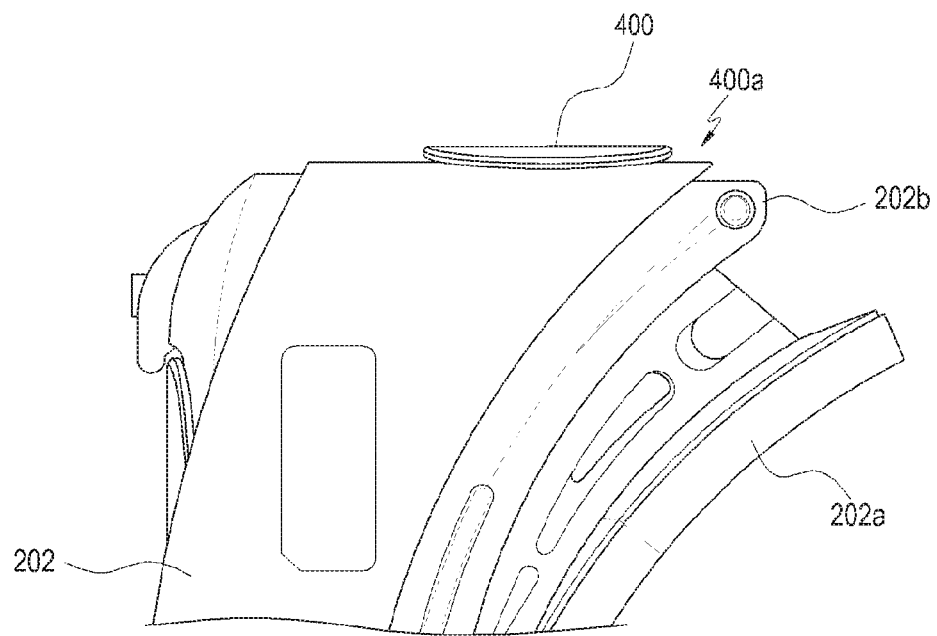
FIG. 9 is an enlarged view of an upper part of a heat radiator according to various embodiments of the present disclosure.
Figure 10:
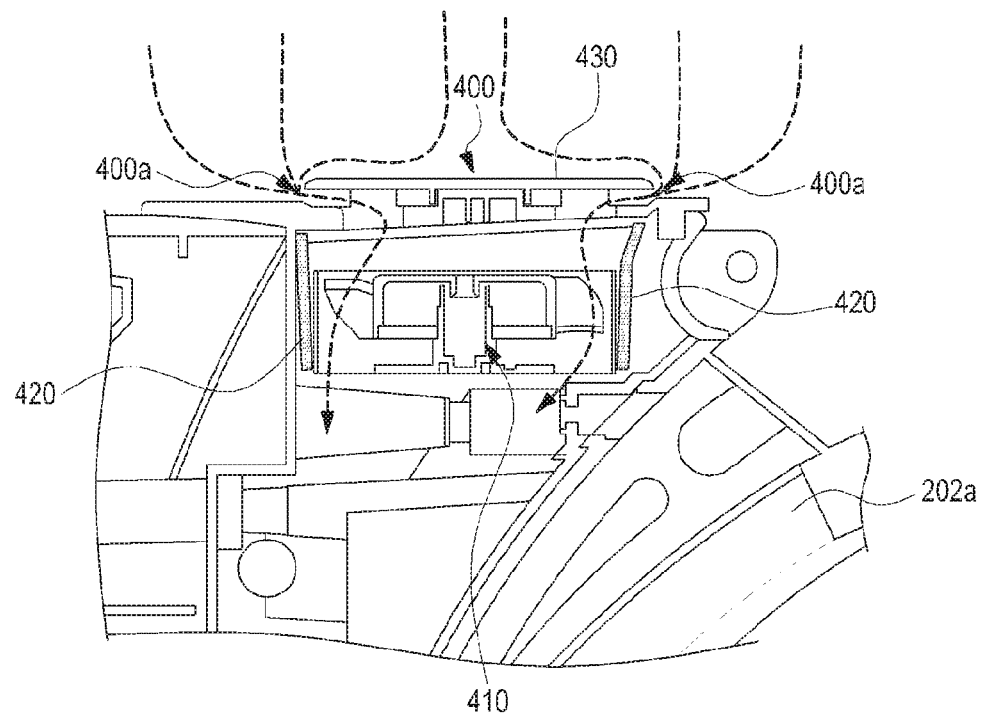
FIG. 10 is a sectional view of the heat radiator illustrated in FIG. 9, taken along line A-A'.

FIG. 8 is an assembled perspective view of an electronic device according to various embodiments of the present disclosure, FIG. 9 is an enlarged view of an upper part of a heat radiator according to various embodiments of the present disclosure, and FIG. 10 is an enlarged sectional view of FIG. 8, taken along line A-A'.

Referring to FIGS. 8 and 9, the heat radiator 400, including the fan 410 and the fan duct 420, may be accommodated in the mounting opening unit 260 (FIG. 6) formed on a side surface of the frame 202, and at least one opening may be formed in the mounting opening unit 260 to allow introduction of air for the fan 410.

The fan cover member 430 may be provided to cover the fan 410 and the fan duct 420 mounted in the mounting opening unit 260. The fan cover member 430 may be detachably mounted on the front surface of the mounting opening unit 260 on the outer surface of the frame 202. The size of the fan cover member 430 may be equal to or larger than the size of the mounting opening unit 260. The fan cover member 430 may fixedly protrude from the surface of the device 200, thus forming an air inlet 400a between the periphery of the fan cover member 430 and the device 200. As the air inlet 400a is formed along the periphery of the fan cover member 430, the air inlet 400a may prevent direct introduction of external air to the fan 410. Furthermore, the fan cover member 430 may hide the fan 410 from the outside, thus enhancing the design aspect of the device 200.

Figure 11A:
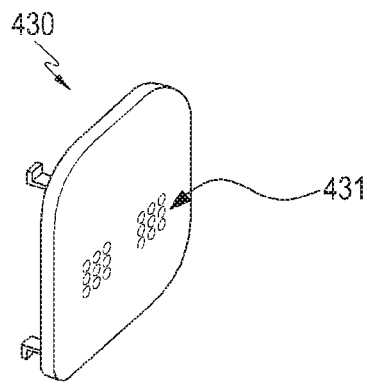
FIG. 11A illustrates another embodiment of a fan cover member according to various embodiments of the present disclosure.
Figure 11B:
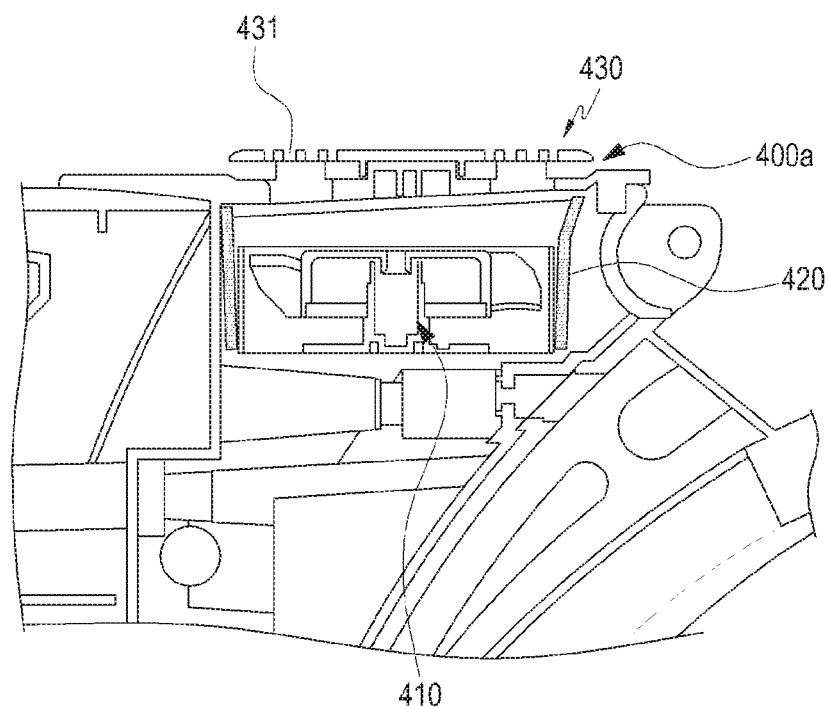
FIG. 11B is a sectional view of a fan cover member according to another embodiment mounted on a frame according to various embodiments of the present disclosure.

FIG. 11A illustrates another embodiment of the fan cover member 430, and FIG. 11B is a sectional view of the fan cover member 430 installed in the frame 202 according to various embodiments of the present disclosure.

Referring to FIGS. 11A and 11B, at least one through hole 431 may be formed in the surface of the fan cover member 430. The through hole 431 may be provided to allow more air in to the frame 202. In the present disclosure, a through hole 431 may be formed in various shapes other than a circle.

Figure 12A:
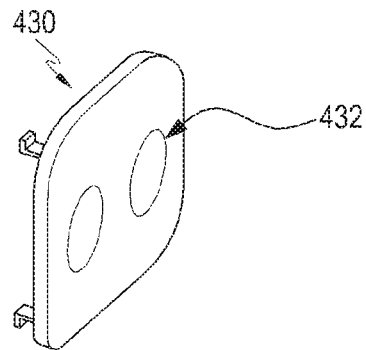
FIG. 12A illustrates a hole cover mounted on a fan cover member having a through hole according to various embodiments of the present disclosure.
Figure 12B:
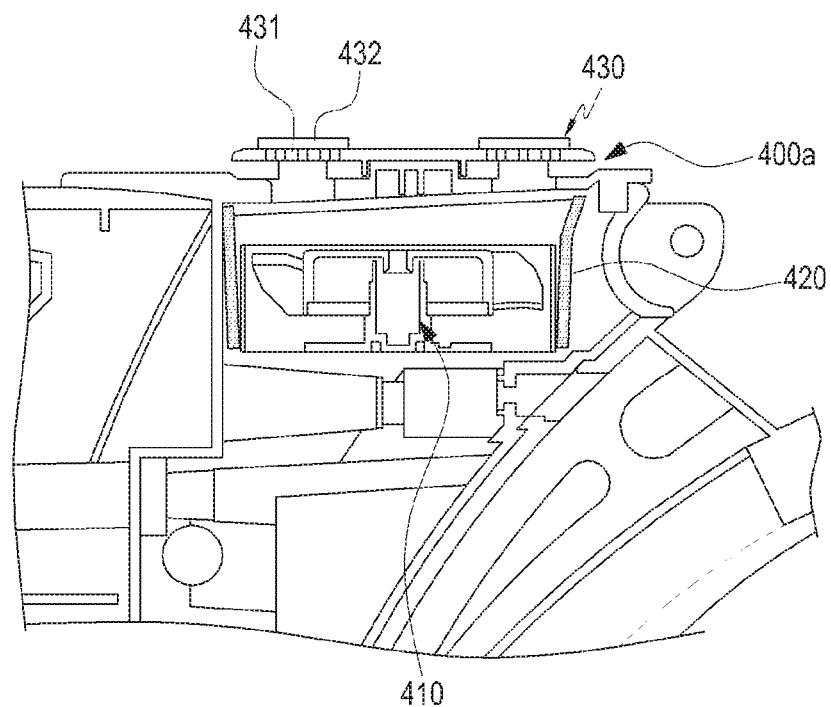
FIG. 12B is a sectional view of a fan cover with a hole cover, mounted on a frame according to various embodiments of the present disclosure.

FIG. 12A illustrates a hole cover 432 provided in the fan cover member 430 having the through hole 431 formed therein according to various embodiments of the present disclosure, and FIG. 12B is a sectional view of the fan cover member 430 with the hole cover 432, mounted on the frame 202 according to various embodiments of the present disclosure.

Referring to FIGS. 12A and 12B, the hole cover 432 may be provided in the fan cover member 430. The hole cover 432 may be detachably attached on the through hole 431, covering the through hole 431. In an ordinary situation of the HMD, for example, if the temperature of the portable electronic device 300 is not high or a temperature detection value of a later-described second sensing unit 270 is equal to or lower than a predetermined threshold temperature, the hole cover 432 may be provided to cover the through hole 431. On the other hand, if the temperature of the portable electronic device 300 rapidly increases or the temperature detection value of the later-described second sensing unit 270 exceeds a threshold temperature during a normal operation state of the fan 410, the through hole 431 may be opened by removing the hole cover 432 from the fan cover member 430. As the through hole 431 is opened by removing the hole cover 432 from the fan cover member 430, more external air may be introduced in to the frame 202.

Figure 13:
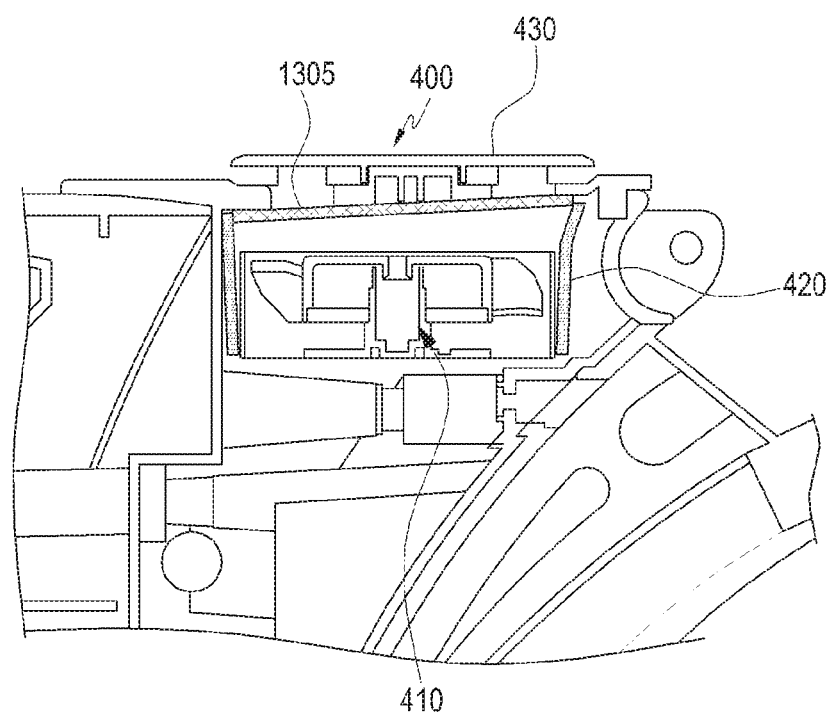
FIG. 13 is a sectional view of a filtering mesh mounted in an electronic device according to various embodiments of the present disclosure.

FIG. 13 is a sectional view of a dustproof mesh 1305 installed in an electronic device according to various embodiments of the present disclosure.

Referring to FIG. 13, the dustproof mesh 1305 may be provided before or after the fan 410 and/or the fan duct 420 to restrict introduction of foreign materials.

When the fan 410 operates and thus external air is introduced in to the frame 202, foreign materials such as external dust may be introduced in to the frame 202. The foreign materials may attach to the surfaces of parts requiring transparency such as the lenses 208 and 210 or the display, thereby contaminating the parts. Thus, the dustproof mesh 1305 may be disposed on at least one surface, for example, a surface before the fan 410 and the fan duct 420, or after the fan 410 and the fan duct 420 in order to filter foreign materials. The dustproof mesh 1305 may be formed of various materials in various shapes as well as a mesh type. For example, the dustproof mesh 1305 may be formed of, for example, felt through which air passes or a multi-porous elastic material.

Figure 14:
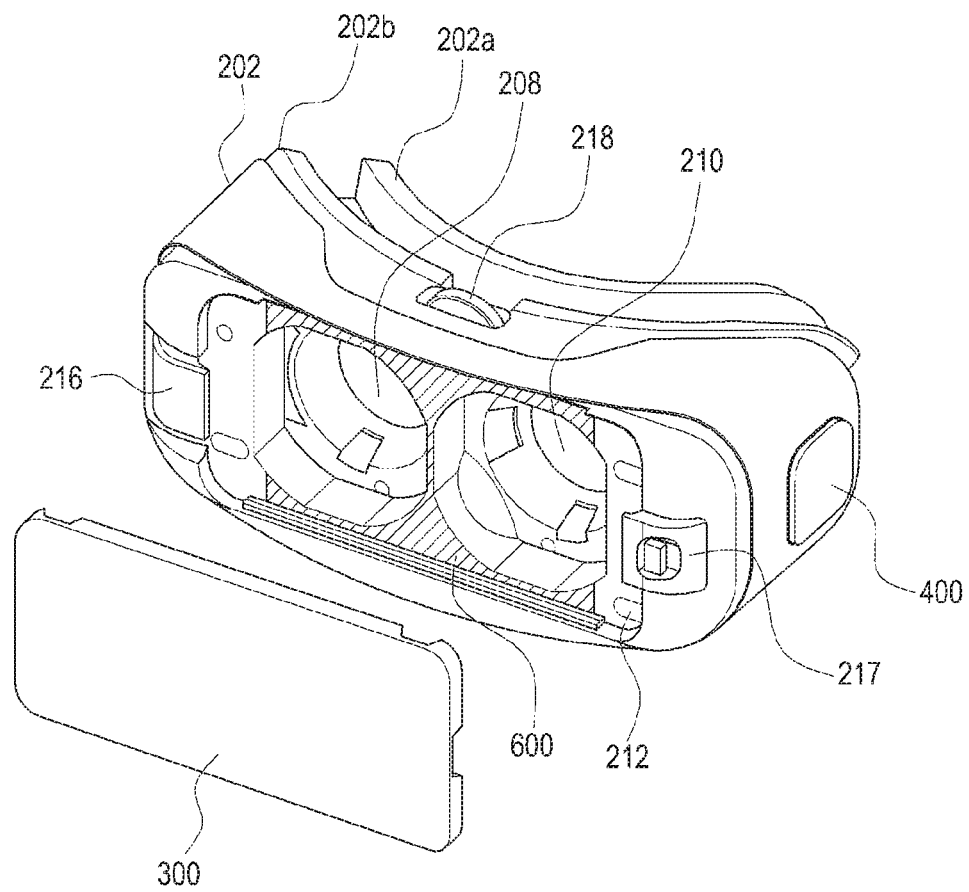
FIG. 14 is a perspective view of a heat diffusion member mounted in at least a part of a device according to various embodiments of the present disclosure.

FIG. 14 is a perspective view of the heat diffusion member 600 on at least one surface of the device 200 according to various embodiments of the present disclosure.

Referring to FIG. 14, the heat diffusion member 600 may be provided in the device 200 to receive heat from the portable electronic device 300 and diffuse the heat. The heat diffusion member 600 may be provided on a surface of the device 200, for example, the mounting surface 212 on which the portable electronic device 300 is mounted. That is, if the portable electronic device 300 is mounted on the device 200, a surface may be formed around the lenses 208 and 210, on which one surface of the display of the portable electronic device 300 faces the mounting surface 212. The heat diffusion member 600 may be provided on a surface on the device 200 which the portable electronic device 300 faces the device 200, forward from the mounting surface 212 to thereby receive heat from the portable electronic device 300. The heat diffusion member 600 may be provided to receive heat generated from the portable electronic device 300 as radiant heat and radiate the heat. The heat diffusion member 600 may be shaped into 'ㅗ' around one surface of the lenses 208 and 210 on the mounting surface 212. The heat diffusion member 600 may be formed of a material containing a metal having high heat conductivity such as aluminum, copper, STS, or a carbon-containing material such as graphite, carbon nanotubes, or graphene.

Furthermore, the heat diffusion member 600 may be formed with a coating such as, for example, diamond like carbon (DLC) coating, plating, or deposition. The heat diffusion member may also comprise, for example, a heat pipe.

The heat diffusion member 600 may be a part of a front case assembled on the front surface of the frame 202 in the device 200. Or the whole front case assembled on the frame 202 may be provided as the heat diffusion member 600 in the device 200. For example, the mounting surface 212 for accommodating the portable electronic device 300 may be formed to be thermally conductive and heat generated from the portable electronic device 300 may be transferred to the device 200, which may be cooled by air flowing in the frame 202. The thermally conductive material may be, for example, thermally conductive plastic, or metal as mentioned above.

Figure 15:
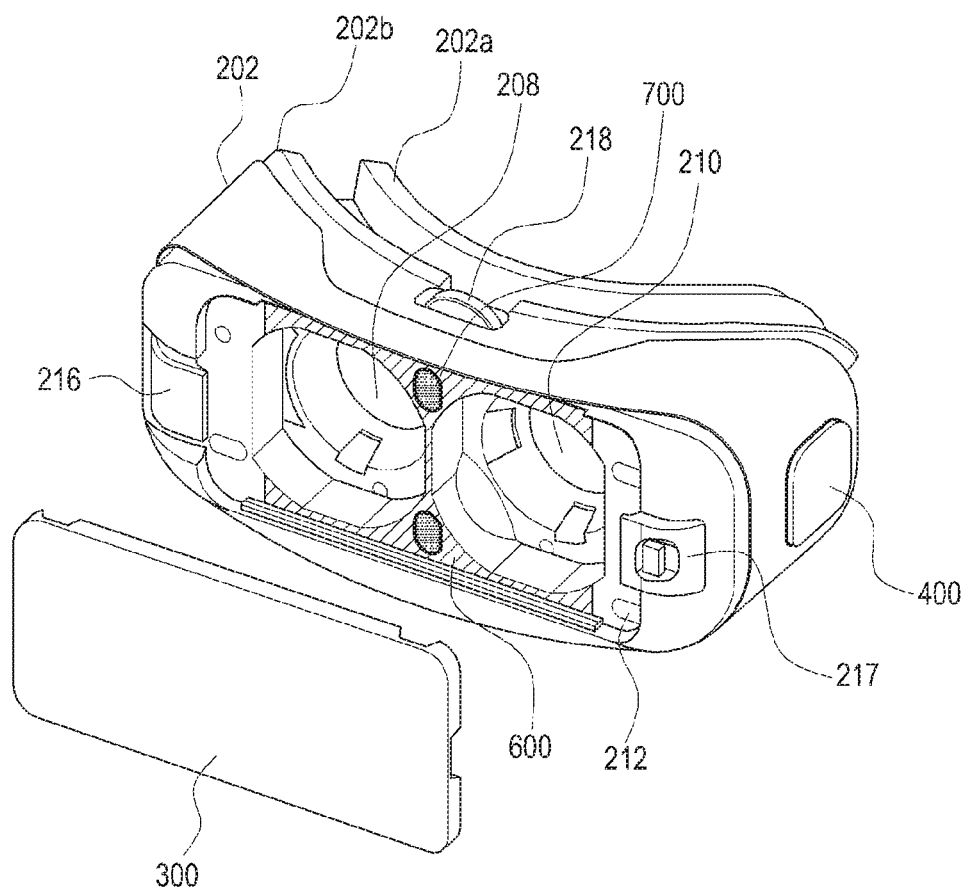
FIG. 15 is a perspective view of an electronic device having a heat transfer member in at least a part of a device according to various embodiments of the present disclosure.
Figure 16:
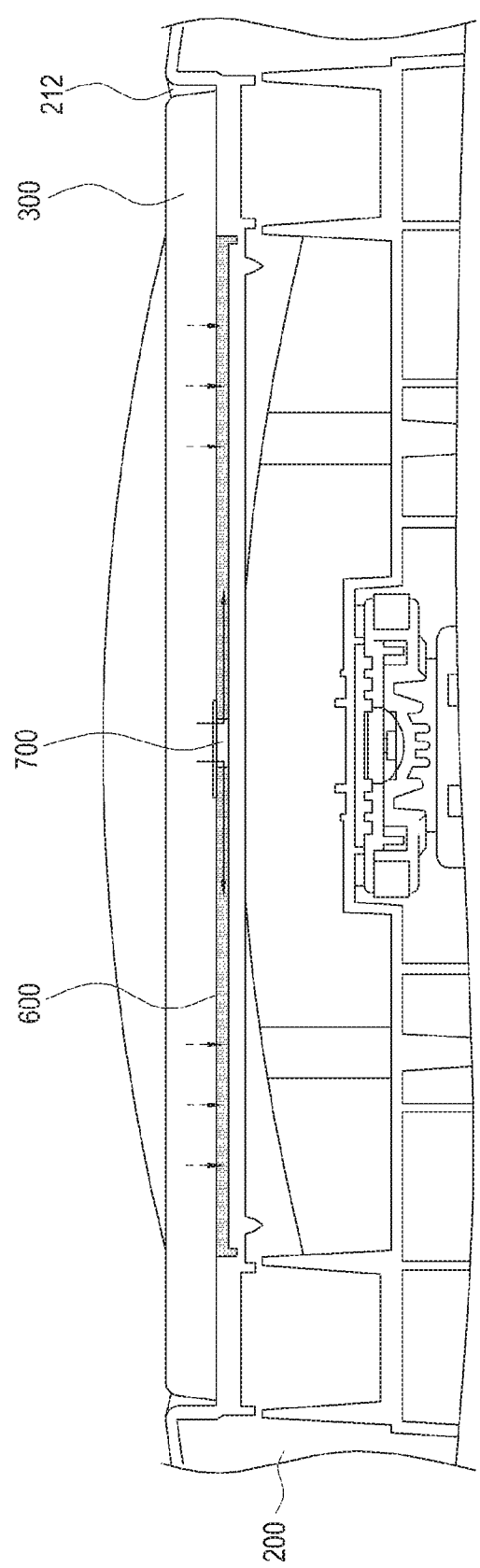
FIG. 16 is a sectional view of an electronic device having a heat transfer member in at least a part of a device according to various embodiments of the present disclosure.
Figure 17:
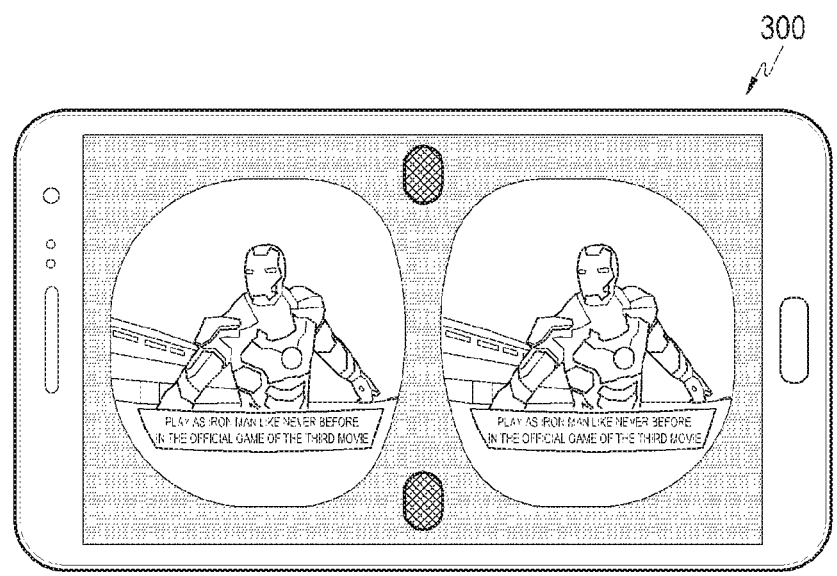
FIG. 17 is a view illustrating parts of a display, which contact a heat transfer member in a portable electronic device according to various embodiments of the present disclosure.

FIG. 15 is a perspective view of the device 200 having the heat transfer members 700 in at least a part of the device 200 according to various embodiments of the present disclosure, FIG. 16 is a front sectional view of the device 200 having the heat transfer members 700 in at least a part of the device 200 according to various embodiments of the present disclosure, and FIG. 17 illustrates a part of the display of the portable electronic device 300 that contacts the heat transfer members 700 according to various embodiments of the present disclosure.

Referring to FIGS. 15, 16, and 17, the heat transfer member 700s may be provided between the heat diffusion member 600 and the portable electronic device 300 to transfer heat from the portable electronic device 300 to the heat diffusion member 600 via conduction. The heat transfer members 700 may distribute the heat generated from the portable electronic device 300 faster than the heat is transferred to the heat diffusion member 600 as radiant heat.

The heat transfer members 700 may be as thick as or thicker than a space between the portable electronic device 300 and the heat diffusion member 600. If the heat transfer members 700 are thicker than the space, the portable electronic device 300 and the heat diffusion member 600 may be brought into closer contact. As a consequence, heat may be transferred more readily from the portable electronic device 300 to the heat diffusion member 600.

The heat transfer members 700 may be formed of a thermal interface material (TIM), or the heat transfer members 700 may be formed of a cushioning material capable of heat transfer, such as thermally conductive sponge. While it is described in various embodiments of the present disclosure that the heat transfer members 700 are formed of a TIM or thermally conductive sponge, by way of example, the present disclosure is not limited thereto. The heat transfer members 700 may be formed of any other material that is capable of transferring heat from the portable electronic device 300 to the heat diffusion member 600.

According to an embodiment of the present disclosure, the heat transfer members 700 are disposed at the center of the heat diffusion member 600, by way of example. Thus, the heat transfer members 700 may be positioned in an inactive area, between active areas of the display screen of the portable electronic device 300 facing the lenses 208 and 210, without interfering with the active display areas.

As the heat transfer members 700 are positioned between the lenses 208 and 210, the heat transfer members 700 may uniformly distribute heat generated by the portable electronic device 300 to the heat diffusion member 600. However, the installation position of the heat transfer members 700 is not limited to a specific position. For example, the heat transfer members 700 may be positioned in any area corresponding to the inactive area(s) of a display surface of the portable electronic device 300. Thus, the heat transfer members 700 may prevent interference with the active display areas.

Figure 18:
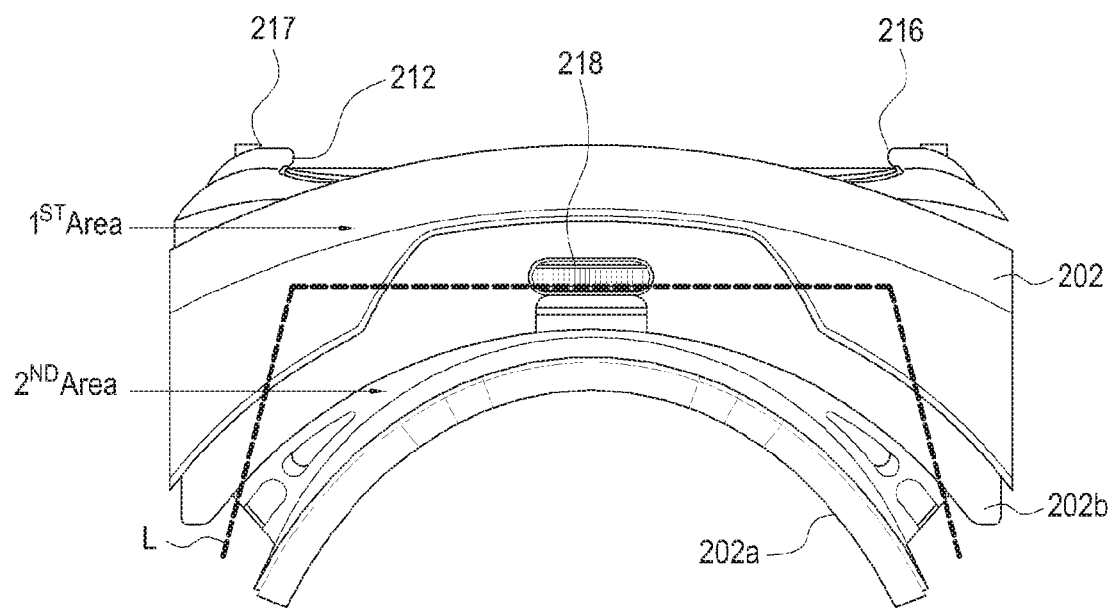
FIG. 18 is a view illustrating a first area and a second area that are defined with respect to a lens assembly in a device according to various embodiments of the present disclosure.
Figure 19:
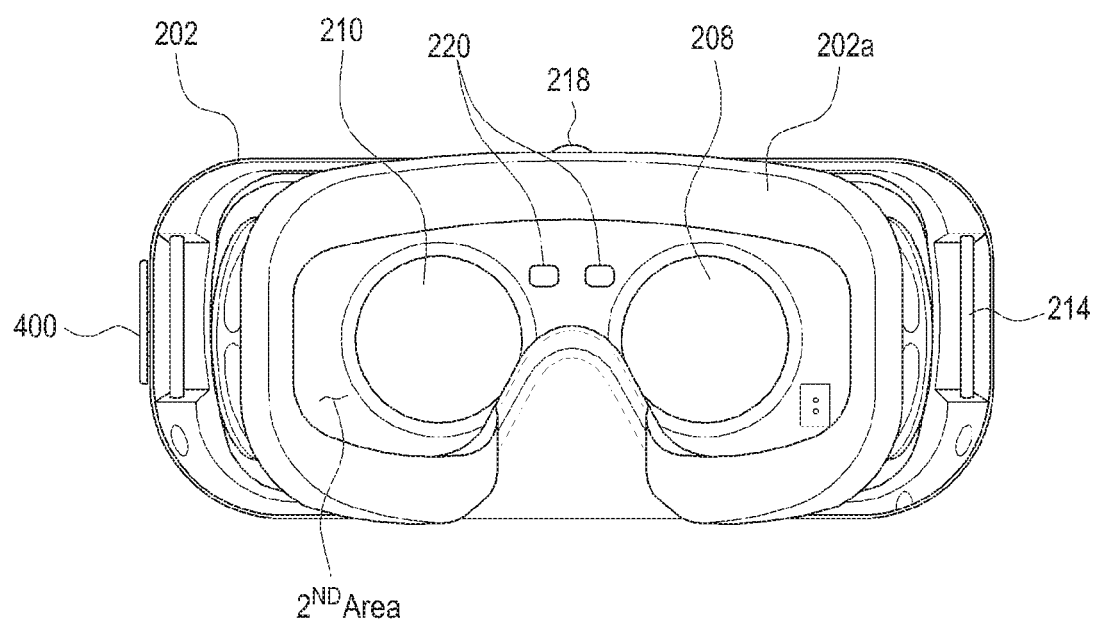
FIG. 19 is a view illustrating a device having a connection hole formed therein according to various embodiments of the present disclosure.
Figure 20:
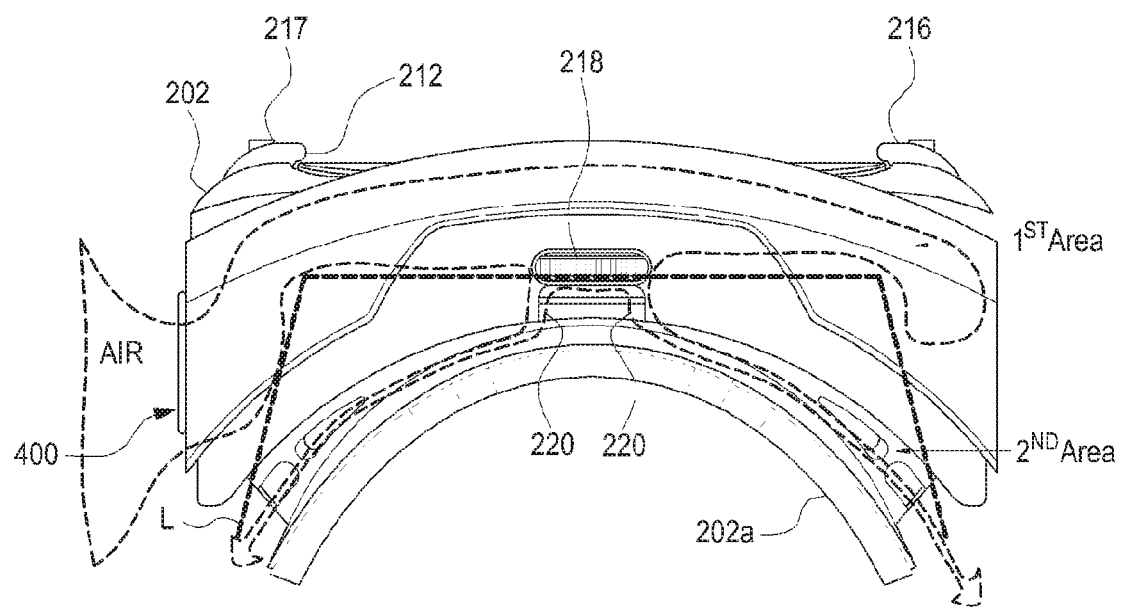
FIG. 20 is a view illustrating introduction of air into a first area and a second area through a connection hole in an electronic device according to various embodiments of the present disclosure.

FIG. 18 illustrates the device 200 divided into a first area and a second area with respect to the lens assembly 202b according to various embodiments of the present disclosure, FIG. 19 illustrates the device 200 having connection holes 220 according to various embodiments of the present disclosure, and FIG. 20 illustrates introduction of air from the first area to the second area through the connection holes 220 in the electronic device according to various embodiments of the present disclosure.

Referring to FIGS. 18, 19, and 20, the device 200 may be divided into the first area and the second area with respect to the lens assembly 202b of the frame 202. The first area may be an area in which air is introduced through the heat radiator 400 in the frame 202, and the second area may be area between the first area and the face of the user.

External air may be introduced into the first area through the fan 410 of the heat radiator 400 to remove heat generated by the portable electronic device 300. However, when the user wears the HMD, heat generated by the face of the user may heat air inside the second area, thus causing condensation on the surfaces of the lenses 208 and 210. Then, as the fan 410 operates, the temperature difference between the surface of the lenses 208 and 210 facing the first area and the surfaces of the lenses 208 and 210 facing the second area becomes greater. Thus, condensation may be produced more easily on the surfaces of the lenses 208 and 210 facing the second area. Therefore, the connection holes 220 may be formed on the surface of the lens assembly 202b facing the second area so that the first area and the second area may share air flow with each other. The connection holes 220 may connect the first area to the second area inside the frame 202 so that air flowing in the first area may be introduced into the second area.

The air introduced from the first area to the second area through the connection holes 220 may come out through openings formed on the face contact 202a that contacts the face of the user. Since air flows to the second area through the connection holes 220, the temperature difference between the first area and the second area may become smaller, and even though the user wears the HMD for a long time, moisture may not condense on the surfaces of the lenses 208 and 210.

Figure 21:
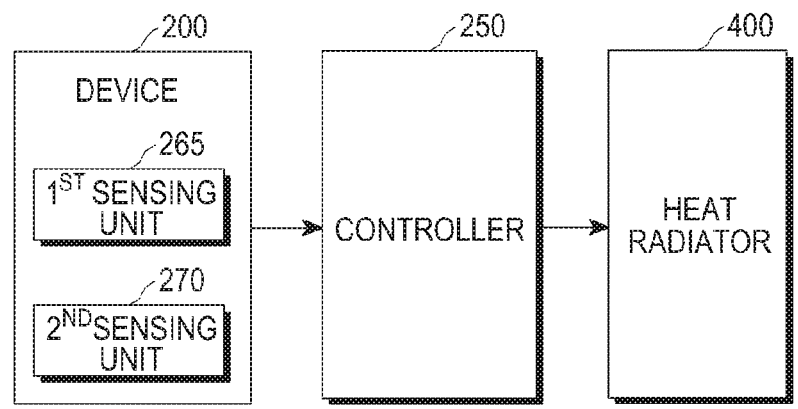
FIG. 21 is a block diagram of a structure for controlling operation of a heat radiator in an electronic device according to various embodiments of the present disclosure.

FIG. 21 is a block diagram of a structure for controlling operation of the heat radiator 400 in an electronic device according to various embodiments of the present disclosure.

Referring to FIG. 21, the device 200 may include a first sensing unit 265, the second sensing unit 270, and a controller 250. The first sensing unit 265 may be provided on the device 200, for example, on the surface of the face contact 202a. The first sensing unit 265 may be provided to sense that the device 200 with the portable electronic device 300 mounted thereon is worn on the face of the user.

The first sensing unit 265 may include a mechanical member such as a switch or a button. Or the first sensing unit 265 may include at least one of a proximity sensor, an illumination sensor, and a grip sensor. In an embodiment of the present disclosure, the first sensing unit 265 is a proximity sensor, by way of example. When the user wears the device 200 on the head, the proximity sensor senses wearing of the device 200 on the head of the user. It may be determined whether to operate the heat radiator 400, for example, the fan 410 depending on whether a signal generated from the proximity sensor has been detected. That is, if a signal indicating the device 200 is on the head of the user is detected from the proximity sensor, the fan 410 may be operated according to the detection value, and heat generated by the device 200 may be dissipated by the fan 410.

While the present disclosure is described in the context that the heat radiator 400 is operated in response to detection of the proximity sensor, this is purely exemplary and does not limit the present disclosure. Thus, many modifications or variations may be made, for example, like control of operation of the heat radiator 400 according to a detection value of the second sensing unit 270 after operation of the proximity sensor, as described below.

The second sensing unit 270 may be provided in the device 200 or the portable electronic device 300. The second sensing unit 270 may be provided to sense heat generated by the portable electronic device 300. The second sensing unit 270 may be, for example, a temperature sensor. While the second sensing unit 270 is described as being provided in the device 200 in an embodiment of the present disclosure, the second sensing unit 270 may be provided in the portable electronic device 300 in order to sense the temperature of the portable electronic device 300 more accurately.

The controller 250 may be provided to control operation of the heat radiator 400 according to a detection value sensed in at least one of the first sensing unit 265 and the second sensing unit 270. Also, the controller 250 may be provided to control an operating mode of the heat radiator 400 according to an input mode that has been set.

Figure 22:
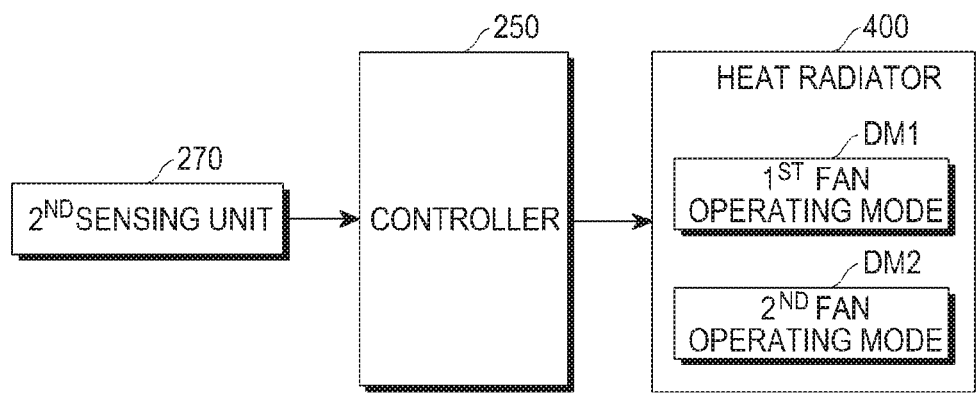
FIG. 22 is a block diagram illustrating operating modes of a heat radiator according to input modes of an electronic device according to various embodiments of the present disclosure.

FIG. 22 is a block diagram illustrating operating modes of the heat radiator 400 according to detection values of the second sensing unit 270 in an electronic device according to various embodiments of the present disclosure.

Figure 23:
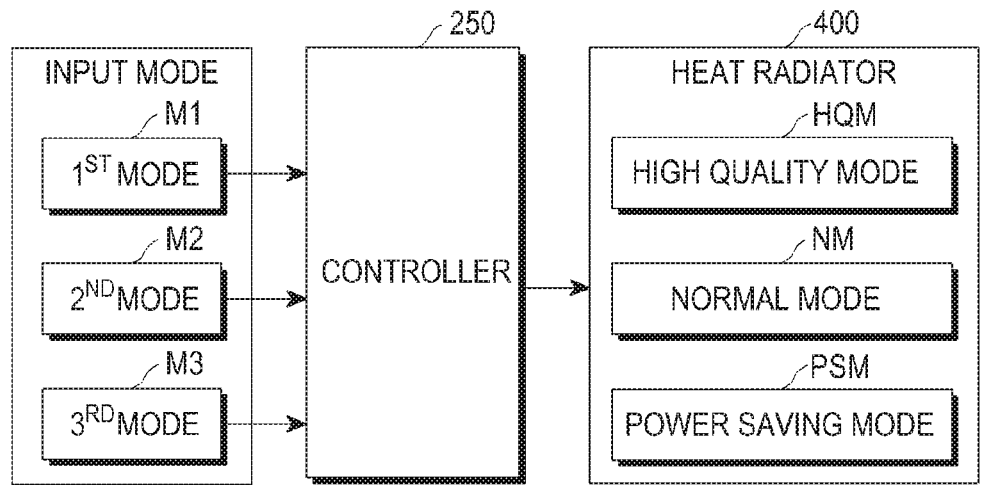
FIG. 23 is a block diagram illustrating operating modes of a heat radiator according to input modes set for an electronic device according to various embodiments of the present disclosure.

Referring to FIG. 22, the heat radiator 400, specifically the fan 410, may operate at a different speed according to a detection value of the second sensing unit 270 according to an embodiment of the present disclosure (see FIG. 23). For example, if a temperature value detected by the second sensing unit 270 is equal to or lower than a predetermined threshold temperature T(ref), the controller 250 may control operation of the fan 410 in a predetermined first fan operating mode DM1 corresponding to a first fan speed. If the temperature value detected by the second sensing unit 270 is higher than the predetermined threshold temperature T(ref), the controller 250 may control operation of the fan 410 in a predetermined second fan operating mode DM2 corresponding to a second fan speed, where the second fan speed may be higher than the first fan speed.

FIG. 23 is a block diagram illustrating operating modes of the heat radiator 400 according to modes of an electronic device that have been set according to various embodiments of the present disclosure.

Referring to FIG. 23, the heat radiator 400 may operate at a different speed according to an input mode that has been set, unlike the foregoing embodiment. For example, three input modes, a first mode M1, a second mode M2, and a third mode M3, may be defined so that the fan 410 may operate at three different speeds. If the first mode M1 is selected, the controller 250 may control operation of the fan 410 and the fan duct 420 in a normal mode (NM) having a first speed. If the second mode M2 is selected, the controller 250 may control operation of the fan 410 and the fan duct 420 in a high quality mode (HQM) having a second speed higher than the first speed. If the third mode M3 is selected, the controller 250 may control operation of the fan 410 and the fan duct 420 in a power saving mode (PSM) having a third speed lower than the first speed.

The heat radiator 400 may be used usually in the NM according to user selection. If the heat radiator 400 is used in the NM, the fan 410 may operate at have the predetermined first speed (in revolutions per minute or RPM). Also, the heat radiator 400 may be used in the PSM according to user selection. If the heat radiator 400 is used in the PSM, less heat may be removed from the portable electronic device 300 than in the NM, but the heat radiator will also use less power. Also, the heat radiator 400 may be used in the HQM according to user selection. If the heat radiator 400 is used in the HQM, more heat may be removed from the portable electronic device 300 than in the NM. Depending on the type of the fan 410, more noise may be generated due to the higher RPM of the fan 410 in the HQM. However, removal of more heat may allow a processor intensive VR application may be executed stably.

Operation of the heat radiator 400 may be controlled according to a detection value of at least one of the first sensing unit 265 and the second sensing unit 270 in the present disclosure. For example, the heat radiator 400 may be turned on/off according to a detection value of the first sensing unit 265 as described in more detail below with respect to FIG. 24. Or the heat radiator 400 may be turned on/off according to a detection value of the second sensing unit 270 as described in more detail below with respect to FIG. 25. Or the heat radiator 400 may be turned on/off according to detection values of the first sensing unit 265 and the second sensing unit 270 as described in more detail below with respect to FIG. 26.

Figure 24:
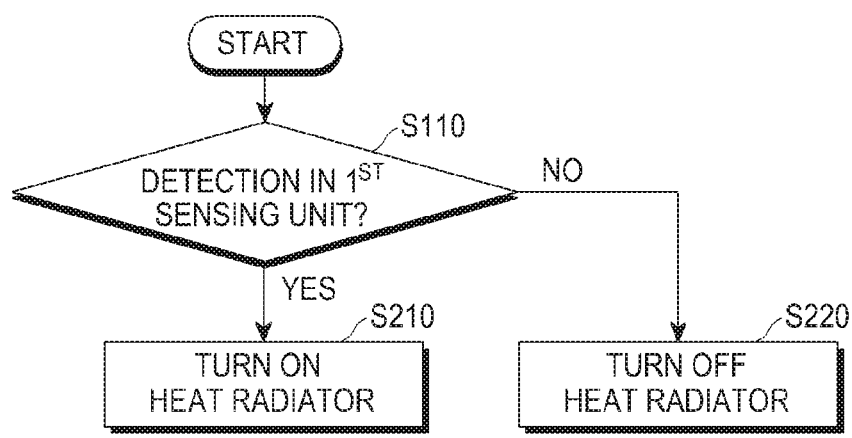
FIG. 24 is a flowchart illustrating an embodiment of a heat control method in an electronic device according to various embodiments of the present disclosure.

FIG. 24 is a flowchart illustrating an embodiment of a heat control method in an electronic device according to various embodiments of the present disclosure.

Referring to FIG. 24, the heat control method may include determining whether a user is wearing the device 200 with the portable electronic device 300 mounted thereon, and the portable electronic device 300 displaying a screen according to at least one of a VR operation and a see-through operation (S110). Depending upon whether the user is wearing the device 200, the heat radiator 400 installed in the device 200 may be turned on to remove heat from the portable electronic device 300 (S210 or S220).

That is, the device 200 determines whether the user is wearing the device 200 through the first sensing unit 265 in operation S110. Then, the device 200 operates the heat radiator 400 by turning on the heat radiator 400 in operation S210 if the first sensing unit 265 indicates the device 200 is being worn by the user, or turns off the heat radiator 400 in operation S220 if the first sensing unit 265 indicates the device 200 is not being worn by the user.

While not shown, the heat control method may further include detecting the temperature of the device 200 through the second sensing unit 270 after determining whether the user is wearing the device 200. As described before with reference to FIG. 23, if a detection value sensed by the second sensing unit 270 is equal to or smaller than a predetermined threshold, the heat radiator 400 may operate in the first fan operating mode DM1. If the detection value sensed by the second sensing unit 270 is larger than the predetermined threshold, the heat radiator 400 may operate in the second fan operating mode DM2, which is faster than the first fan operating mode DM1.

Furthermore, if the heat radiator 400 is turned on, the operating speed of the heat radiator 400 may be different according to an input mode which has been set, as illustrated in FIG. 23. For example, if the first mode M1 is selected, the fan 410 and the fan duct 420 may operate in the NM having the first speed. If the second mode M2 is selected, the fan 410 and the fan duct 420 may operate in the HQM having the second speed higher than the first speed. If the third mode M3 is selected, the fan 410 and the fan duct 420 may operate in the PSM having the third speed lower than the first speed.

Figure 25:
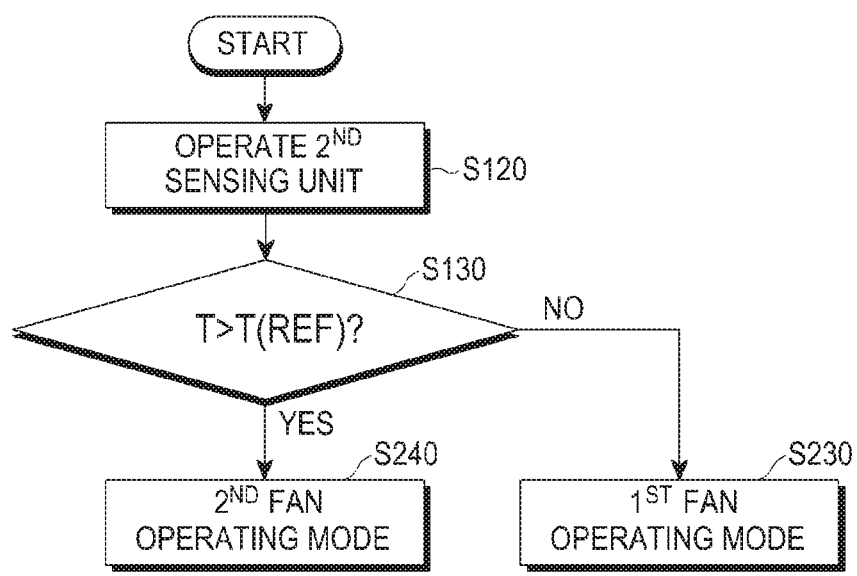
FIG. 25 is a flowchart illustrating another embodiment of the heat control method in an electronic device according to various embodiments of the present disclosure.

FIG. 25 is a flowchart illustrating another embodiment of the heat control method in an electronic device according to various embodiments of the present disclosure.

Referring to FIG. 25, the heat control method may include detecting the temperature of the portable electronic device 300 displaying a screen according to at least one of a VR operation and a see-through operation, mounted on the first electronic device or the device 200 (S120 and S130), and operating the heat radiator 400 installed in the device 200 to remove heat from the portable electronic device 300 according to the temperature (S230 or S240).

That is, when the second sensing unit 270 is operated (S120), the device 200 detects the temperature of the portable electronic device 300 through the second sensing unit 270 and compares the detected temperature with a predetermined threshold (S130). If the temperature detected by the second sensing unit 270 is equal to or lower than the threshold temperature T(ref), the heat radiator 400 is turned on. The heat radiator 400 may be turned on to operate in the first fan operating mode DM1 (S230). If the temperature detected by the second sensing unit 270 is higher than the temperature T(ref), the heat radiator 400 is turned on. The heat radiator 400 may be turned on to operate in the second fan operating mode DM2 (S240).

Figure 26:
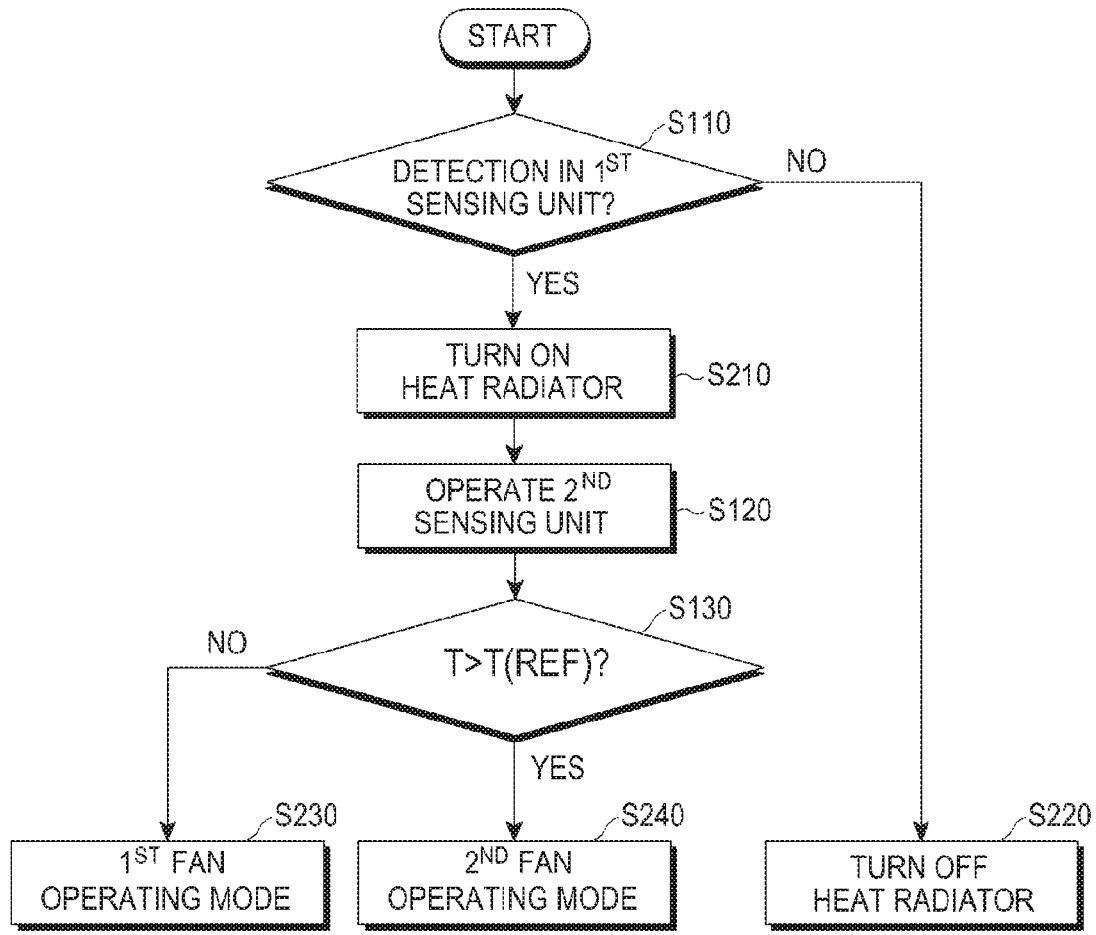
FIG. 26 is a flowchart illustrating another embodiment of the heat control method in an electronic device according to various embodiments of the present disclosure.

FIG. 26 is a flowchart illustrating another embodiment of the heat control method in an electronic device according to various embodiments of the present disclosure.

Referring to FIG. 26, the heat control method may include determining whether a user wears the device 200 with the portable electronic device 300 mounted thereon around the face of the user, the portable electronic device 300 displaying a screen according to at least one of a VR operation and a see-through operation (S110), detecting the temperature of the portable electronic device 300 according to operation of the portable electronic device 300 (S120 and S130), and operating the heat radiator 400 installed in the device 200 to remove heat from the portable electronic device 300 (S210, S230, and S240).

That is, the device 200 determines whether the user is wearing the device 200 through the first sensing unit 265 (S110). Then, the device 200 operates the heat radiator 400 by turning on the heat radiator 400 according to a detection value of the first sensing unit 265 (S210) or turns off the heat radiator 400 according to the detection value of the first sensing unit 265 (S220).

When the heat radiator 400 is operating (S210), the second sensing unit 270 may detect the temperature of the device 200 (S120). As described before with reference to FIG. 22, if a detection value sensed by the second sensing unit 270 is equal to or smaller than a predetermined threshold temperature T(ref) (S130), the heat radiator 400 may operate in the first fan operating mode DM1 (S230). If the detection value sensed by the second sensing unit 270 is larger than the predetermined threshold temperature T(ref), the heat radiator 400 may operate in the second fan operating mode DM2 (S240), which is faster than in the first fan operating mode DM1.

The operating speed of the heat radiator 400 may be different according to an input mode which has been set, as illustrated in FIG. 23. For example, if the first mode M1 is selected, the fan 410 and the fan duct 420 may operate in the NM having the first speed. If the second mode M2 is selected, the fan 410 and the fan duct 420 may operate in the HQM having the second speed higher than the first speed. If the third mode M3 is selected, the fan 410 and the fan duct 420 may operate in the PSM having the third speed lower than the first speed.

As is apparent from the foregoing description, an electronic device according to various embodiments of the present disclosure efficiently removes heat generated during operation of an HMD. Thus, a wearer can have stable operation of the HMD.

According to various embodiments of the present disclosure, the electronic device moves some of the external air introduced into a first area by a heat radiator to a second area inward toward the user from the first area. Therefore, the temperature difference between the first area and the second area can be lessened and condensation on the surfaces of lenses provided in the HMD can be alleviated.

According to various embodiments of the present disclosure, the electronic device can control operation of the heat radiator according to the user wearing the HMD or the temperature of the electronic device sensed by a sensing unit.

While the disclosure has been shown and described with reference to certain exemplary embodiments, it will be understood by those skilled in the art that various changes in form and details may be made to those embodiments without departing from the spirit and scope of the disclosure as defined by the appended claims and their equivalents.

What is claimed is:

1. An electronic device comprising:
 a frame including at least one optical assembly and a structure configured to receive a portable electronic device including a display, wherein an image on the display can be seen through the at least one optical assembly when the portable electronic device is in the structure;
 a wearing member connected to the frame and configured to be worn together with the frame on a head of a user; and
 a heat radiator configured to remove heat from a space between the display and the optical assembly to outside the electronic device, wherein:
 the heat radiator comprises a fan,
 the frame comprises a mounting opening unit formed on a side surface thereof in which the fan is mounted, and
 the fan is configured to introduce air from outside the electronic device in to the frame or discharge air in the frame to outside the electronic device.

2. The electronic device of claim 1, wherein the heat radiator further comprises:
 a fan duct surrounding the fan; and
 a fan cover member detachably mounted to cover the mounting opening unit.

3. The electronic device of claim 2, wherein the fan cover member substantially covers the mounting opening unit, and wherein an air inlet is formed between a periphery of the fan cover member and the electronic device by the fan cover member being over a surface of the electronic device.

4. The electronic device of claim 2, wherein at least one through hole is formed in the fan cover member.

5. The electronic device of claim 4, wherein the fan cover member further comprises a hole cover detachably mounted on the fan cover member to cover the through hole.

6. The electronic device of claim 1, wherein a filter is further included to filter air drawn in by the fan.

7. The electronic device of claim 1, wherein the heat radiator comprises a heat diffusion member.

8. The electronic device of claim 7, wherein the heat diffusion member is formed of a material comprising at least one of: aluminum, copper, stainless steel (STS), and carbon, wherein the carbon is in a form of at least one of graphite, carbon nanotubes, and graphene.

9. The electronic device of claim 7, wherein the heat diffusion member is configured to conduct heat, and is at least one of: a heat pipe and material formed with at least one of diamond like carbon (DLC) coating, plating, and deposition.

10. The electronic device of claim 7, wherein the heat diffusion member is inserted into a part of a front case provided on a front surface of the frame or is the front case.

11. The electronic device of claim 7, further comprising a heat transfer member between the heat diffusion member and the portable electronic device, for transferring heat from the portable electronic device to the heat diffusion member.

12. The electronic device of claim 11, wherein a thickness of the heat transfer member is equal to or larger than a thickness of a space between the portable electronic device and the heat diffusion member.

13. The electronic device of claim 11, wherein the heat transfer member is formed of at least one of a thermal interface material (TIM) and thermally conductive sponge.

14. The electronic device of claim 11, wherein the heat transfer member is disposed in at least one of: a center of the heat diffusion member and in an inactive area of a screen of the portable electronic device.

15. The electronic device of claim 1, wherein when the electronic device is worn on a head of the user, the heat radiator is configured to generate an air flow from at least a part of a space between the optical assembly and eyes of the user.

16. The electronic device of claim 15, wherein a connection hole is formed for air flow to the space between the optical assembly and the eyes of the user.

17. The electronic device of claim 1, further comprising a proximity sensor, wherein when the portable electronic device is received in the structure, the heat radiator is configured to operate in response to a signal from the proximity sensor.

18. The electronic device of claim 17, further comprising a controller configured to control operation of the heat radiator in response to the signal from the proximity sensor.

19. The electronic device of claim 18, wherein the controller is configured to control an operating mode of the heat radiator according to an input mode that has been set.

20. The electronic device of claim 19, wherein the heat radiator comprises a fan, and wherein the controller is configured to control the fan to operate in at least one of: a normal mode for operating the fan at a first speed, a high quality mode for operating the fan at a second speed faster than the first speed, and a power saving mode for operating the fan at a third speed slower than the first speed.

21. The electronic device of claim 20, wherein a signal is provided to the controller by at least one of: the portable electronic device and a temperature sensor included in the electronic device, and wherein the temperature sensor is configured to sense heat generated from the portable electronic device.

22. The electronic device of claim 21, wherein if a detection value corresponding to the signal is equal to or smaller than a predetermined threshold, the controller controls the fan to rotate in a first fan operating mode, and if the detection value corresponding to the signal from the temperature sensor is larger than the predetermined threshold, the controller controls the fan to rotate in a second fan operating mode in which the fan rotates faster than in the first fan operating mode.

23. An electronic device comprising:
    a frame including at least one optical assembly and a structure to receive a portable electronic device including a display, and wherein when an image on the display can be seen through the at least one optical assembly when the portable electronic device is mounted in the structure;
    a wearing member connected to the frame and configured to be worn together with the frame on a head of a user; and
    a fan configured to generate air flow in a space between the display and the optical assembly, wherein:
    the frame comprises a mounting opening unit formed on a side surface thereof in which the fan is mounted, and
    the fan is configured to introduce air from outside the electronic device in to the frame or discharge air in the frame to outside the electronic device.

24. The electronic device of claim 23, further comprising a proximity sensor, wherein when the portable electronic device is mounted in the structure, the fan operates in response to a signal from the proximity sensor.

25. The electronic device of claim 24, wherein the fan is operated in at least one of a normal mode for operating the fan at a first speed, a high quality mode for operating the fan at a second speed larger than the first speed, and a power saving mode for operating the fan at a third speed smaller than the first speed.

26. The electronic device of claim 24, wherein a signal is provided to a controller by at least one of: the portable electronic device and a temperature sensor included in the electronic device, and wherein the temperature sensor is configured to sense heat generated from the portable electronic device.

27. The electronic device of claim 26, wherein if a detection value corresponding to the signal is equal to or smaller than a predetermined threshold, the controller controls the fan to rotate in a first fan operating mode, and if the detection value corresponding to the signal from the temperature sensor is larger than the predetermined threshold, the controller controls the fan to rotate in a second fan operating mode in which the fan rotates faster than in the first fan operating mode.

28. A method for controlling heat radiation in an electronic device, the method comprising:
    making a determination of whether a user is wearing the electronic device with a portable electronic device mounted thereon, the portable electronic device displaying a screen according to at least one of a virtual reality (VR) operation and a see-through operation; and
    operating a heat radiator installed in the electronic device to remove heat from the portable electronic device, wherein:
    the heat radiator comprises a fan,
    the heat radiator is installed in a frame of the electronic device,
    the frame includes at least one optical assembly and a structure to receive the portable electronic device,
    the frame comprises a mounting opening unit formed on a side surface thereof in which the fan is mounted, and
    the fan is configured to introduce air from outside the electronic device in to the frame or discharge air in the frame to outside the electronic device.

29. The method of claim 28, wherein the electronic device includes a proximity sensor configured to sense whether the user is wearing the electronic device, and wherein the determination is based on a detection value of the proximity sensor.

30. The method of claim 28, further comprising detecting temperature of the electronic device after the determination.

31. The method of claim 30, wherein the electronic device further includes a temperature sensor configured to detect temperature of the portable electronic device, and wherein the heat radiator operates in a first fan operating mode if a detection value corresponding to a signal from the temperature sensor is equal to or smaller than a predetermined threshold, and the heat radiator operates in a second fan operating mode having a higher speed than the first fan operating mode if the detection value corresponding to the signal from the temperature sensor is larger than the predetermined threshold.

32. The method of claim 28, wherein the heat radiator operates in at least one of a normal mode having a first speed, a high quality mode having a second speed larger than the first speed, and a power saving mode having a third speed smaller than the first speed.

33. A method for controlling heat radiation in an electronic device, the method comprising:
  detecting temperature of a portable electronic device when the portable electronic device is mounted in the electronic device and is displaying images according to at least one of a virtual reality (VR) operation and a see-through operation; and
  operating a heat radiator installed in the electronic device to remove heat from the portable electronic device according to a result of detecting the temperature, wherein:
    the heat radiator comprises a fan,
    the heat radiator is installed in a frame of the electronic device,
    the frame includes at least one optical assembly and a structure to receive the portable electronic device,
    the frame comprises a mounting opening unit formed on a side surface thereof in which the fan is mounted, and
    the fan is configured to introduce air from outside the electronic device in to the frame or discharge air in the frame to outside the electronic device.

34. The method of claim 33, wherein a temperature sensor installed in the electronic device detects the temperature of the portable electronic device, and
  wherein the heat radiator operates in a first fan operating mode if a detection value corresponding to a signal from the temperature sensor is equal to or smaller than a predetermined threshold, and operates the heat radiator in a second fan operating mode having a higher speed than the first fan operating mode if the detection value corresponding to the signal from the temperature sensor is larger than the predetermined threshold.

35. A method for controlling heat radiation in an electronic device, the method comprising:
  making a determination of whether a user is wearing the electronic device with a portable electronic device mounted thereon, the portable electronic device displaying a screen according to at least one of a virtual reality (VR) operation and a see-through operation;
  detecting temperature of the portable electronic device; and
  operating a heat radiator installed in the electronic device to remove heat from the portable electronic device, wherein:
    the heat radiator comprises a fan,
    the heat radiator is installed in a frame of the electronic device,
    the frame includes at least one optical assembly and a structure to receive the portable electronic device,
    the frame comprises a mounting opening unit formed on a side surface thereof in which the fan is mounted, and
    the fan is configured to introduce air from outside the electronic device in to the frame or discharge air in the frame to outside the electronic device.

36. The method of claim 35, wherein the electronic device includes a proximity sensor configured to sense whether the user is wearing the electronic device, and
  wherein the determination of whether the user is wearing the electronic device is based on a signal from the proximity sensor.

37. The method of claim 36, wherein the heat radiator is turned on or turned off in response to the determination.

38. The method of claim 35, wherein detecting the temperature of the portable electronic device is by a temperature sensor installed in the electronic device, and
  wherein the operating comprises operating the heat radiator in a first fan operating mode if a detection value corresponding to a signal from the temperature sensor is equal to or smaller than a predetermined threshold, and operating the heat radiator in a second fan operating mode having a higher speed than the first fan operating mode if the detection value corresponding to the signal from the temperature sensor is larger than the predetermined threshold.

* * * * *